(12) United States Patent  
Murooka

(10) Patent No.: US 9,508,430 B2  
(45) Date of Patent: Nov. 29, 2016

(54) THREE DIMENSIONAL MEMORY DEVICE INCLUDING MEMORY CELLS WITH RESISTANCE CHANGE LAYERS

(71) Applicant: Kabushiki Kaisha Toshiba, Tokyo (JP)

(72) Inventor: Kenichi Murooka, San Jose, CA (US)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/849,023

(22) Filed: Sep. 9, 2015

(65) Prior Publication Data

US 2016/0267968 A1    Sep. 15, 2016

Related U.S. Application Data

(60) Provisional application No. 62/130,947, filed on Mar. 10, 2015.

(51) Int. Cl.
*G11C 13/00* (2006.01)
*G11C 16/10* (2006.01)

(52) U.S. Cl.
CPC ......... *G11C 13/004* (2013.01); *G11C 13/0069* (2013.01); *G11C 13/0097* (2013.01)

(58) Field of Classification Search
CPC .......... G11C 13/0002; G11C 2213/71; G11C 13/0097; G11C 13/0007; G11C 13/0023; G11C 7/1006; H01L 27/2436; H01L 27/2481; H01L 27/249; H01L 45/145
See application file for complete search history.

(56) References Cited

U.S. PATENT DOCUMENTS

| 8,963,115 | B2 | 2/2015 | Murooka | |
|---|---|---|---|---|
| 8,971,093 | B2 | 3/2015 | Murooka | |
| 9,123,411 | B2 | 9/2015 | Murooka | |
| 9,129,677 | B2 | 9/2015 | Murooka | |
| 2008/0239818 | A1* | 10/2008 | Mokhlesi | ......... H01L 27/11568 365/185.17 |
| 2012/0069626 | A1* | 3/2012 | Nakano | ............. G11C 13/0004 365/148 |

(Continued)

FOREIGN PATENT DOCUMENTS

JP    2013-120618    6/2013

OTHER PUBLICATIONS

U.S. Appl. No. 14/017,727, filed Sep. 4, 2013, Murooka.

(Continued)

*Primary Examiner* — Hien Nguyen
(74) *Attorney, Agent, or Firm* — Oblon, McClelland, Maier & Neustadt, L.L.P.

(57) ABSTRACT

A memory device includes a plurality of first interconnects extending in a first direction; a plurality of second interconnects extending in the first direction; a plurality of third interconnects extending in a third direction; and memory cells each with resistance change layers provided on two side surfaces of a corresponding one of the third interconnects, which surfaces are opposite to each other in the second direction. The resistance change layers are connected to the different second interconnects. A plurality of selectors connect the third interconnects to the first interconnects. One of the selectors includes a semiconductor layer provided between the corresponding third interconnect and the corresponding first interconnect. Gates extending in the second direction and provided, via a gate insulating film, on two side surfaces that are opposite to each other in the first direction.

20 Claims, 28 Drawing Sheets

(56) References Cited

U.S. PATENT DOCUMENTS

| | | |
|---|---|---|
| 2012/0147644 A1 | 6/2012 | Scheuerlein |
| 2012/0147645 A1 | 6/2012 | Scheuerlein |
| 2012/0147646 A1 | 6/2012 | Scheuerlein |
| 2012/0147647 A1 | 6/2012 | Scheuerlein |
| 2012/0147648 A1 | 6/2012 | Scheuerlein |
| 2012/0147649 A1 | 6/2012 | Samachisa et al. |
| 2012/0147650 A1 | 6/2012 | Samachisa et al. |
| 2012/0147651 A1 | 6/2012 | Scheuerlein et al. |
| 2012/0147652 A1 | 6/2012 | Scheuerlein |
| 2012/0147689 A1* | 6/2012 | Scheuerlein ....... G11C 13/0002 365/230.03 |
| 2013/0148400 A1 | 6/2013 | Murooka |
| 2013/0187118 A1 | 7/2013 | Murooka |
| 2015/0171144 A1 | 6/2015 | Murooka |

OTHER PUBLICATIONS

U.S. Appl. No. 14/593,254, filed Jan. 9, 2015, Murooka.

* cited by examiner

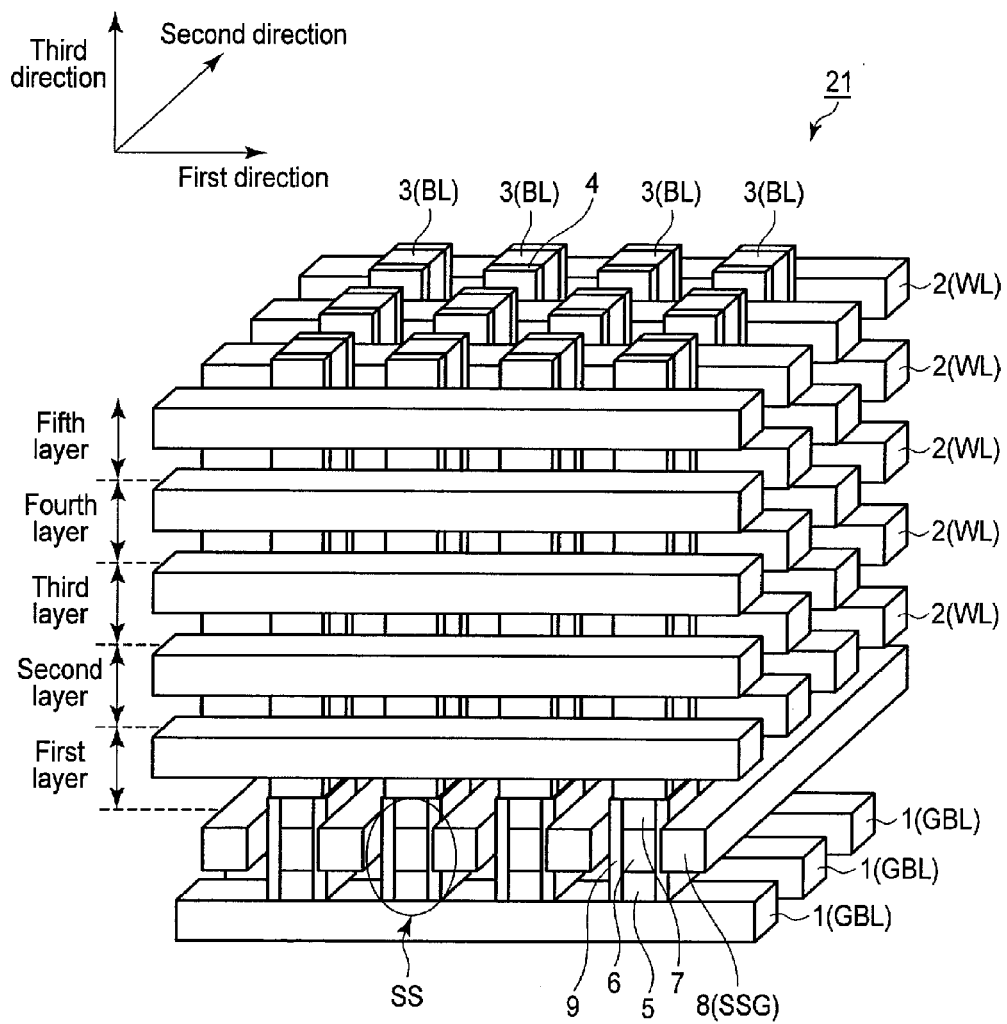
F I G. 1

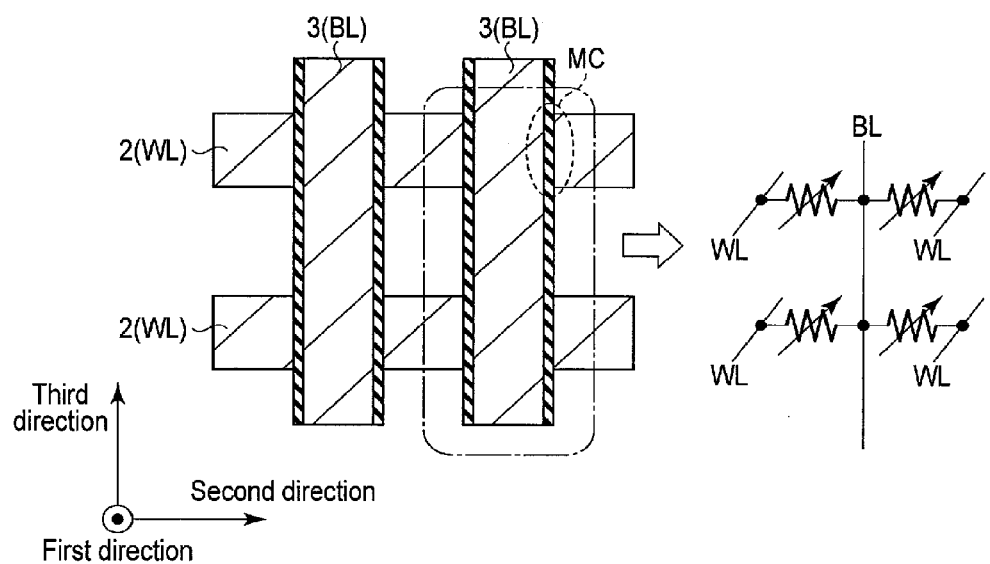
F I G. 2

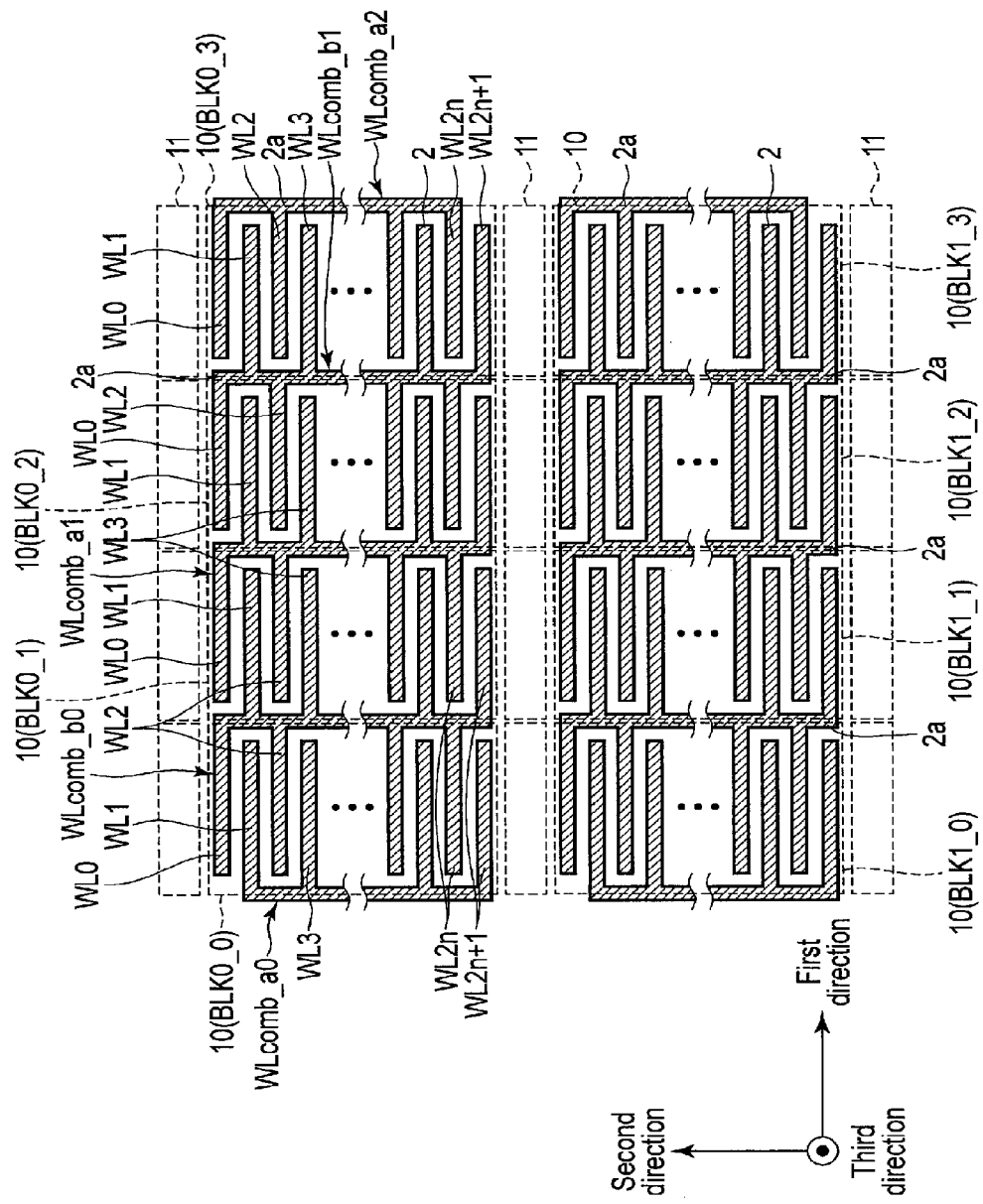
F I G. 3

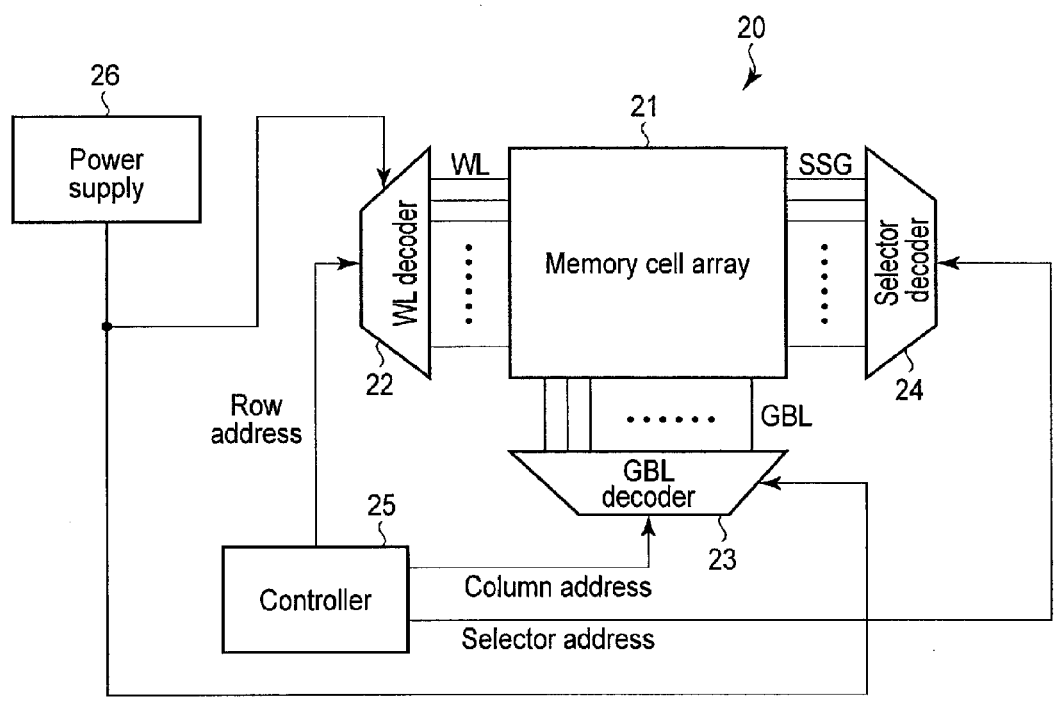
F I G. 7

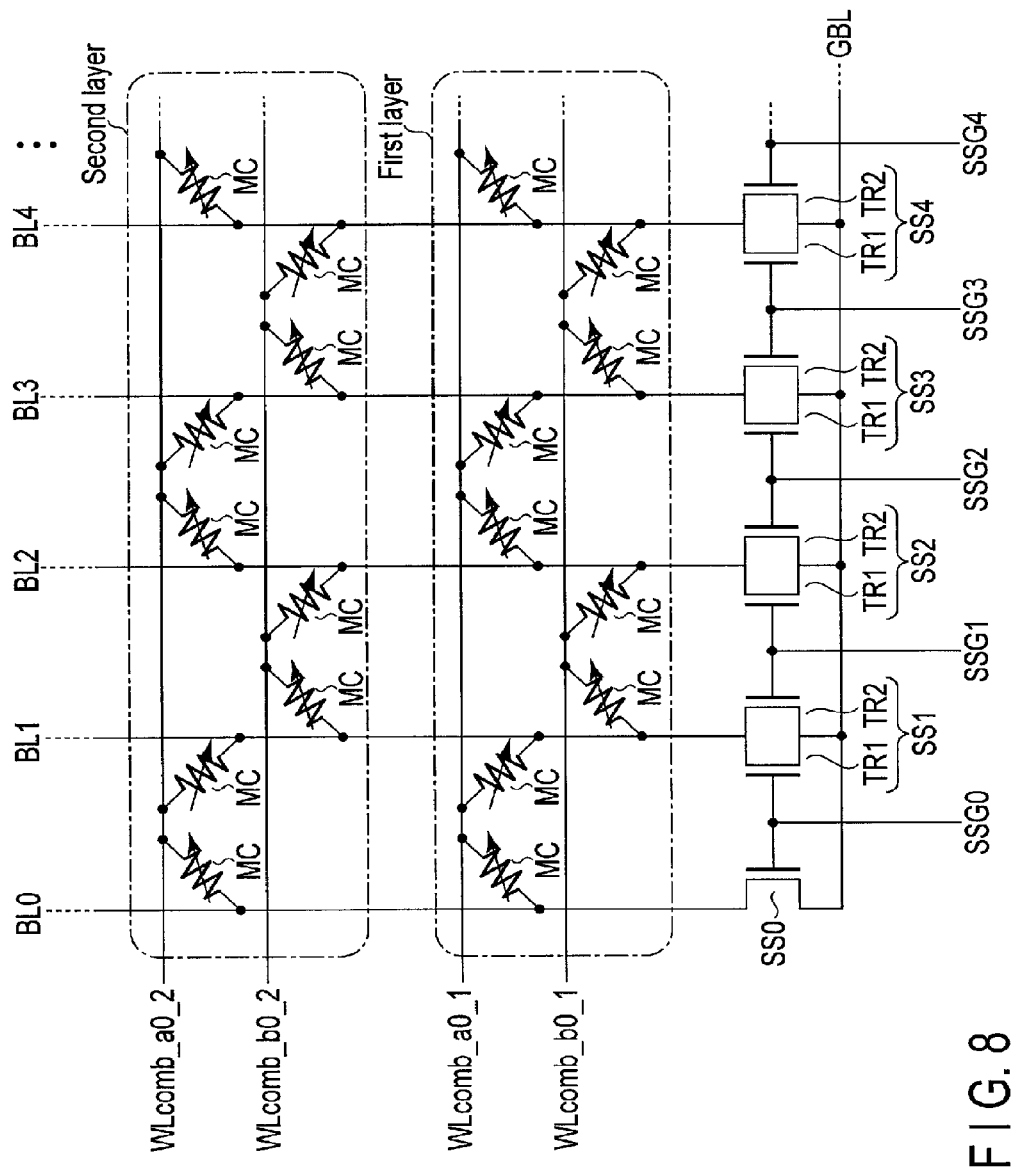
F I G. 8

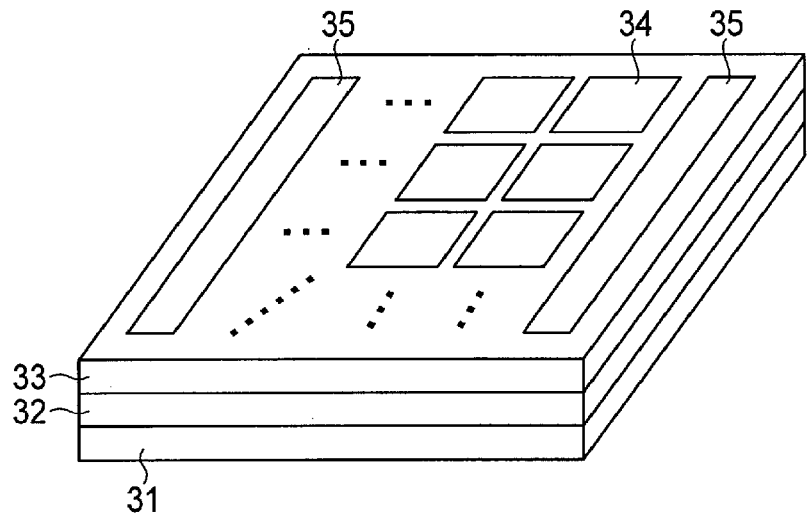
F I G. 9
| | Write | Erase | Read |
|---|---|---|---|
| SSG_s | Vg_w | Vg_e | Vg_r |
| SSG_n | Vg_w | Vg_e | 0 |
| SSG_u | 0 | 0 | 0 |
| GBL_s | Vw | +1 | Vr+Vo |
| GBL_u | Vw/2 | (Ve/2)+1 | Vr+Vo |
| WL_s | 0 | Ve+1 | Vo |
| WL_u | Vw/2 | (Ve/2)+1 | Vr+Vo |
F I G. 10

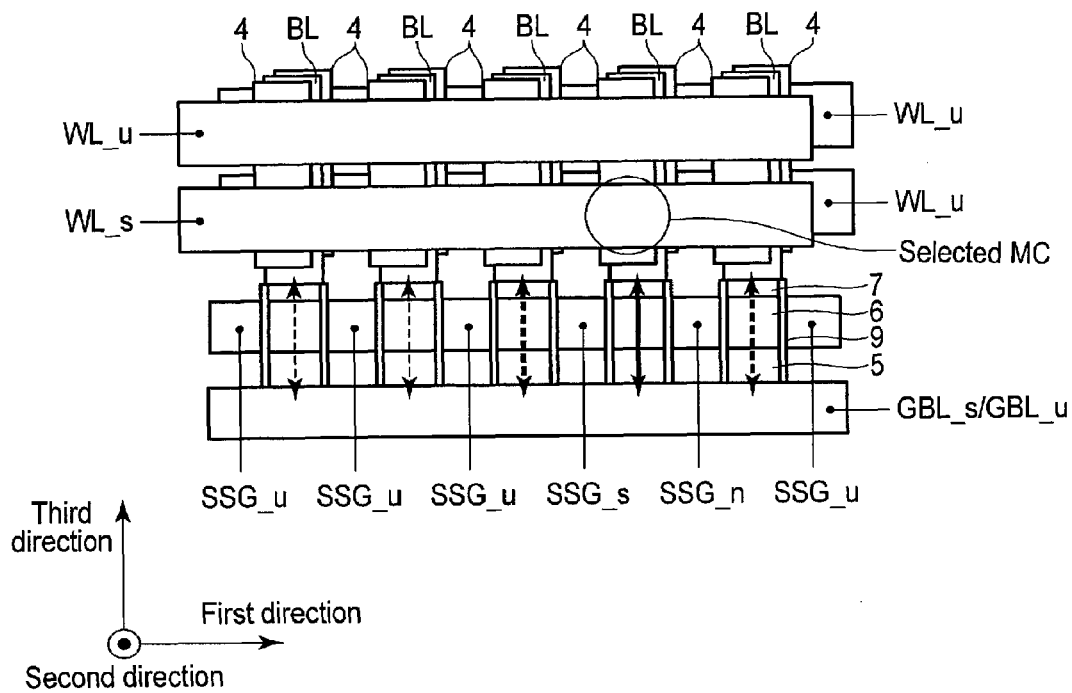
F I G. 11
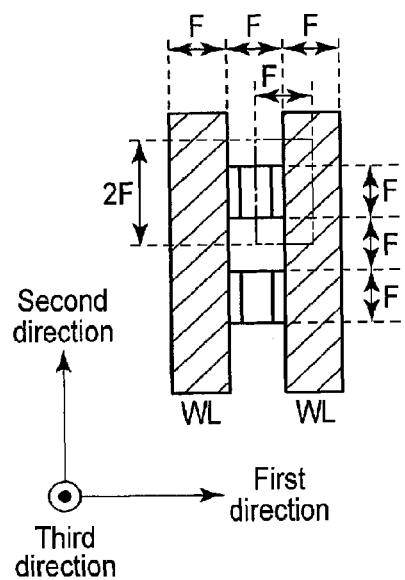
F I G. 12
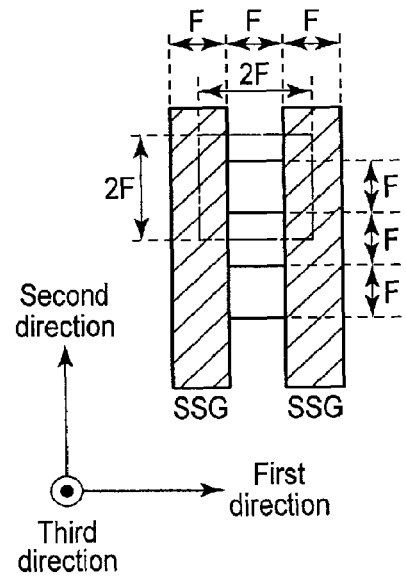
F I G. 13

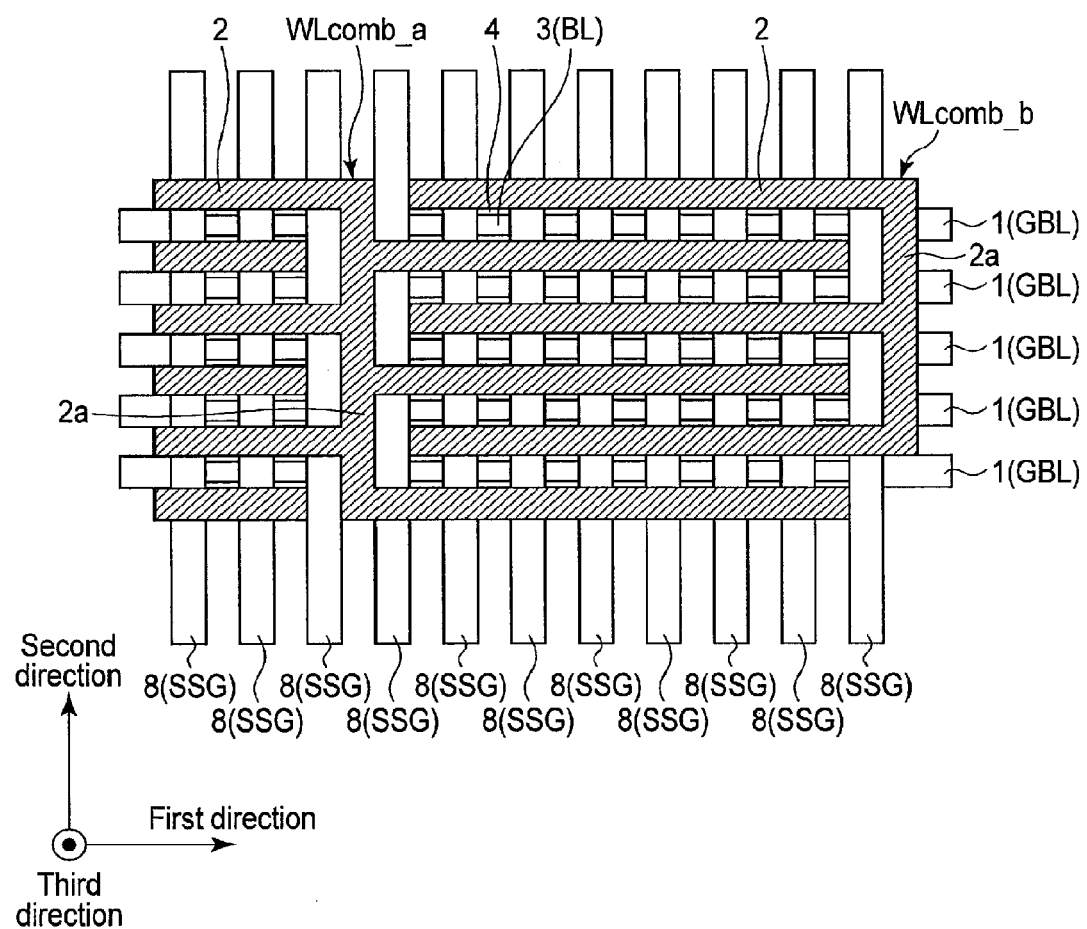
F I G. 14

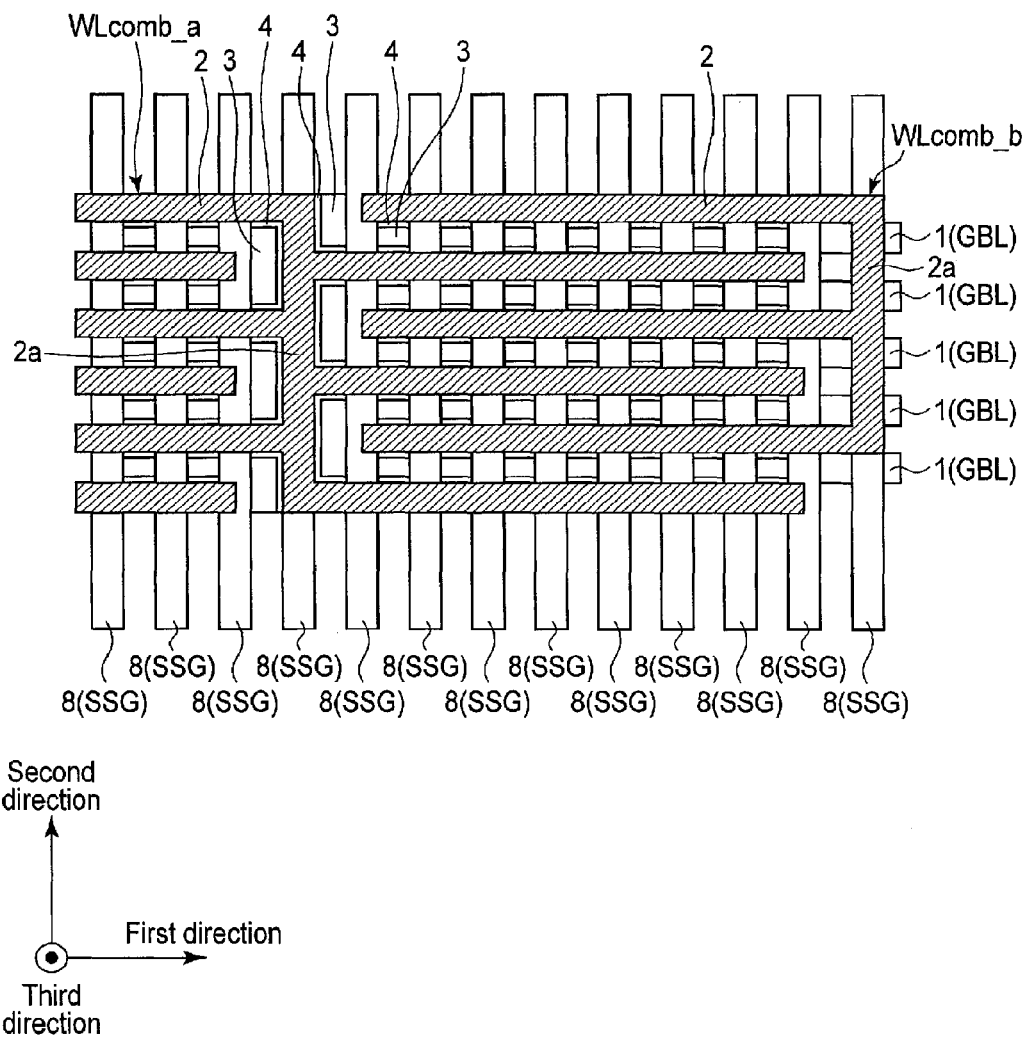
F I G. 15

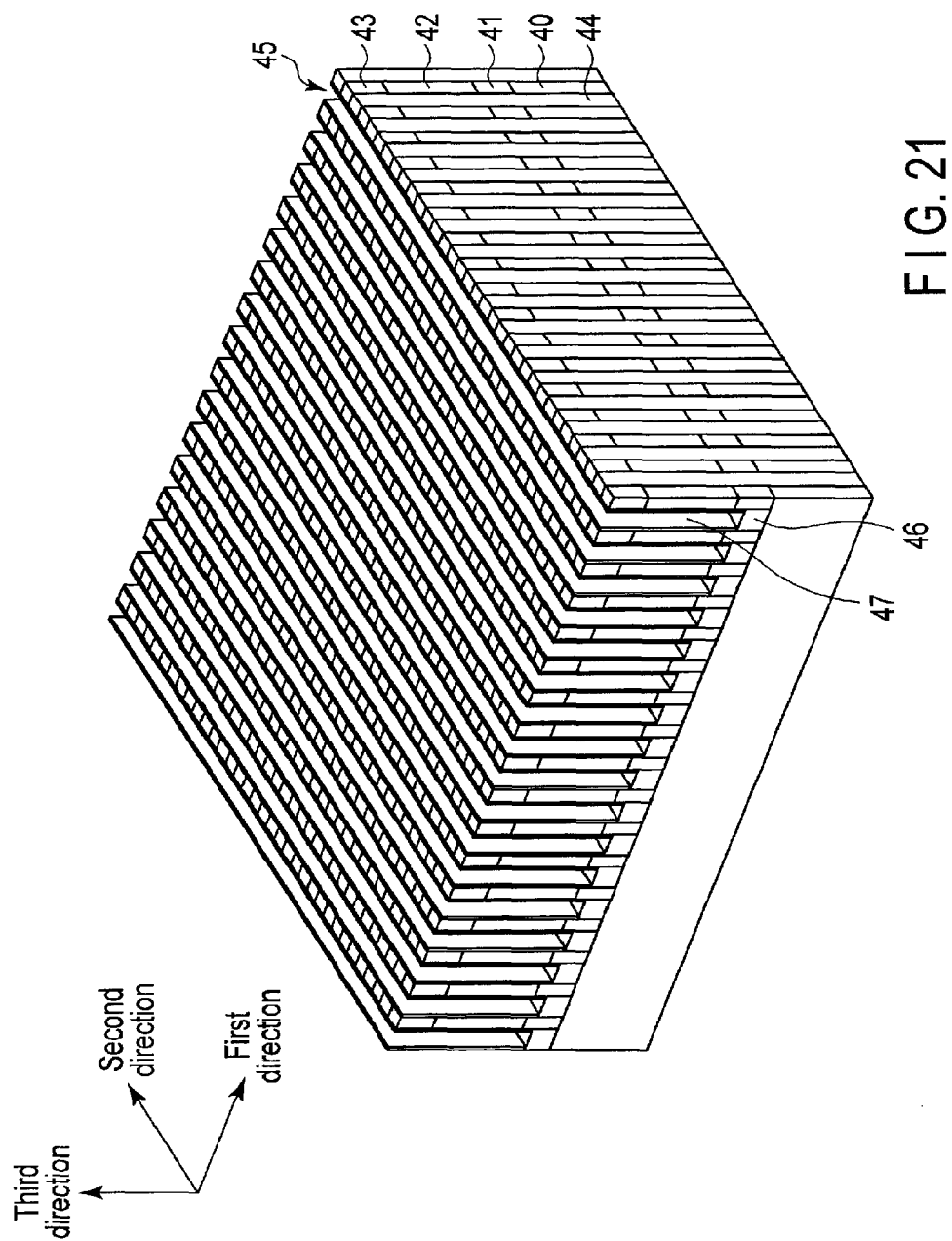
F I G. 21

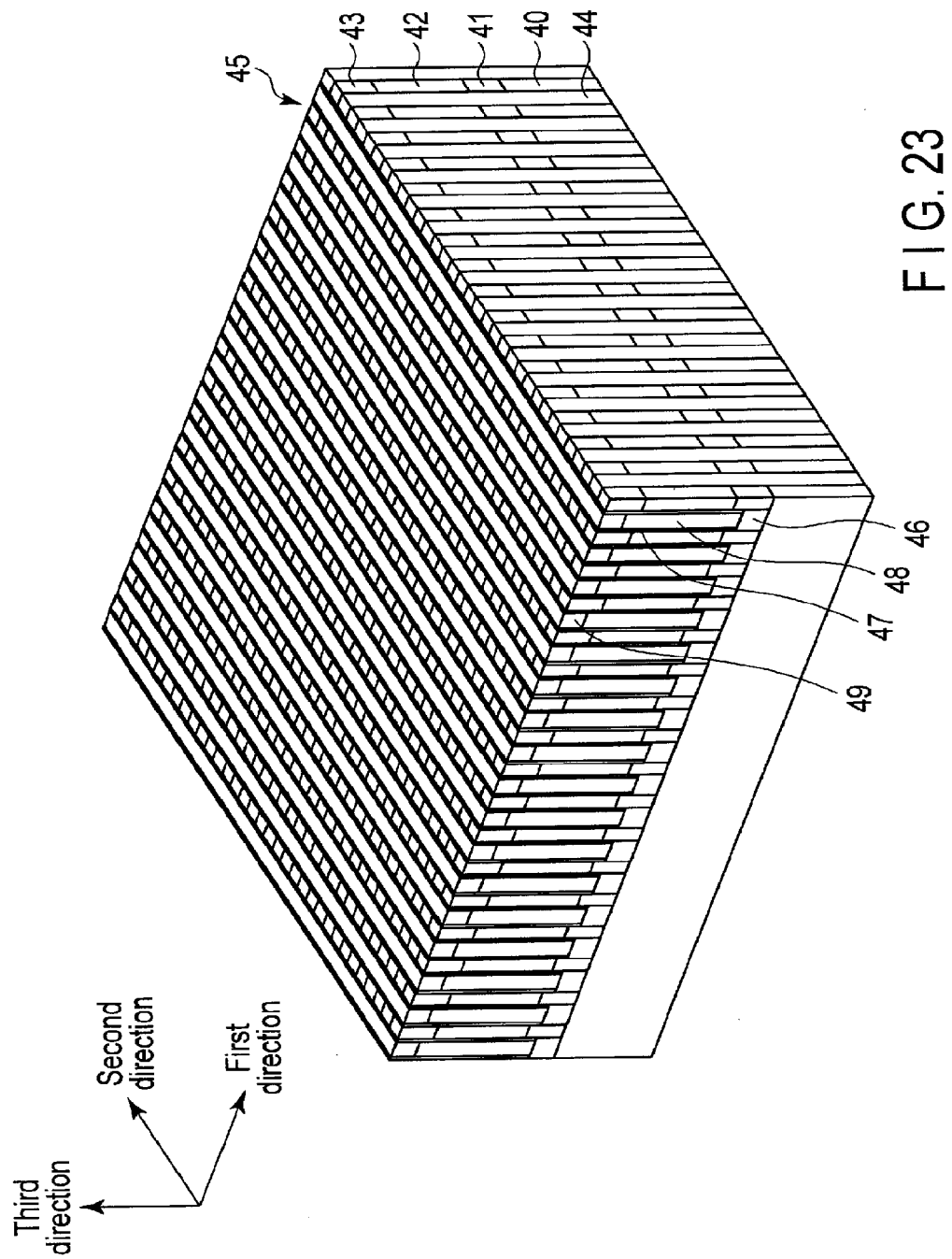
F I G. 23

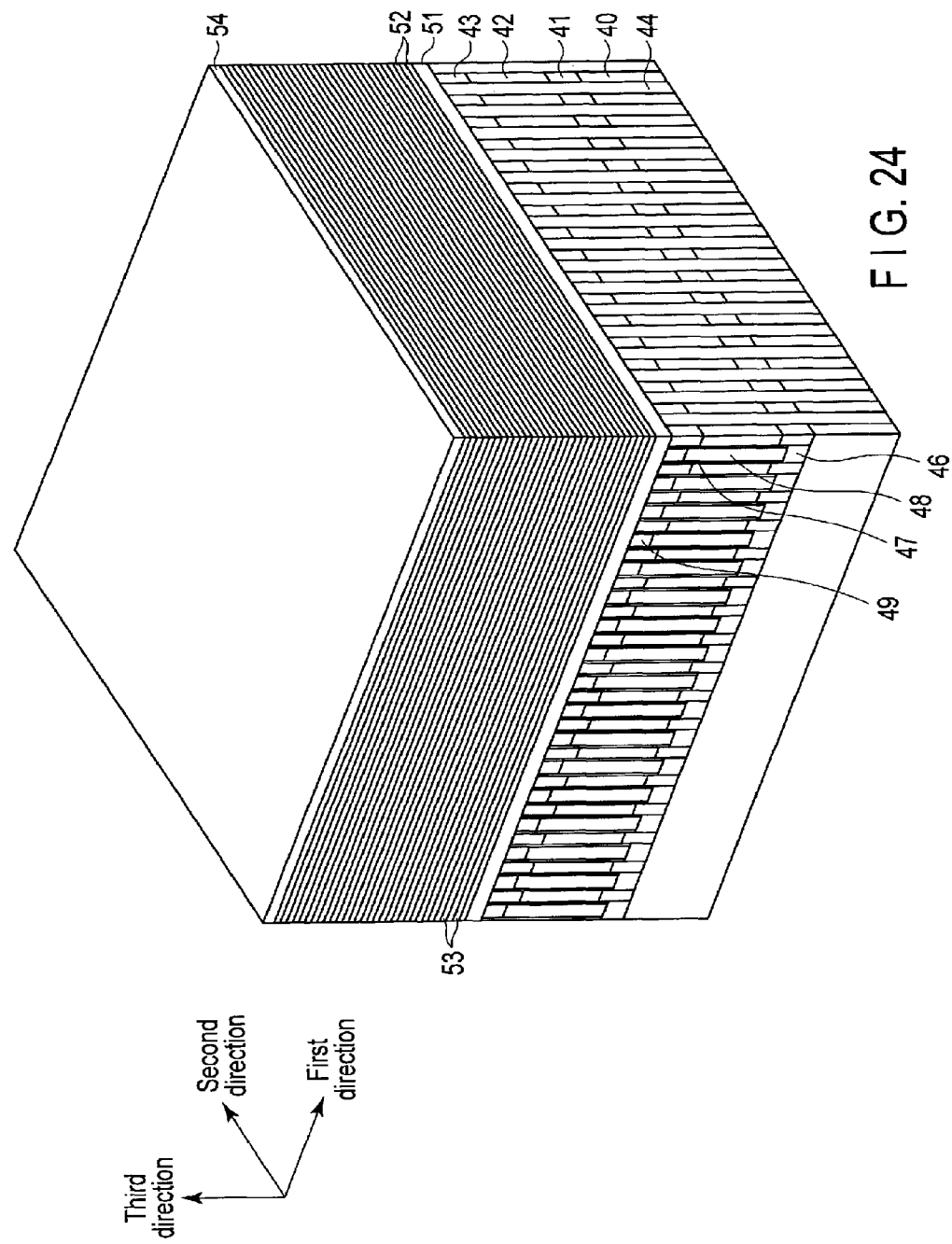
F I G. 24

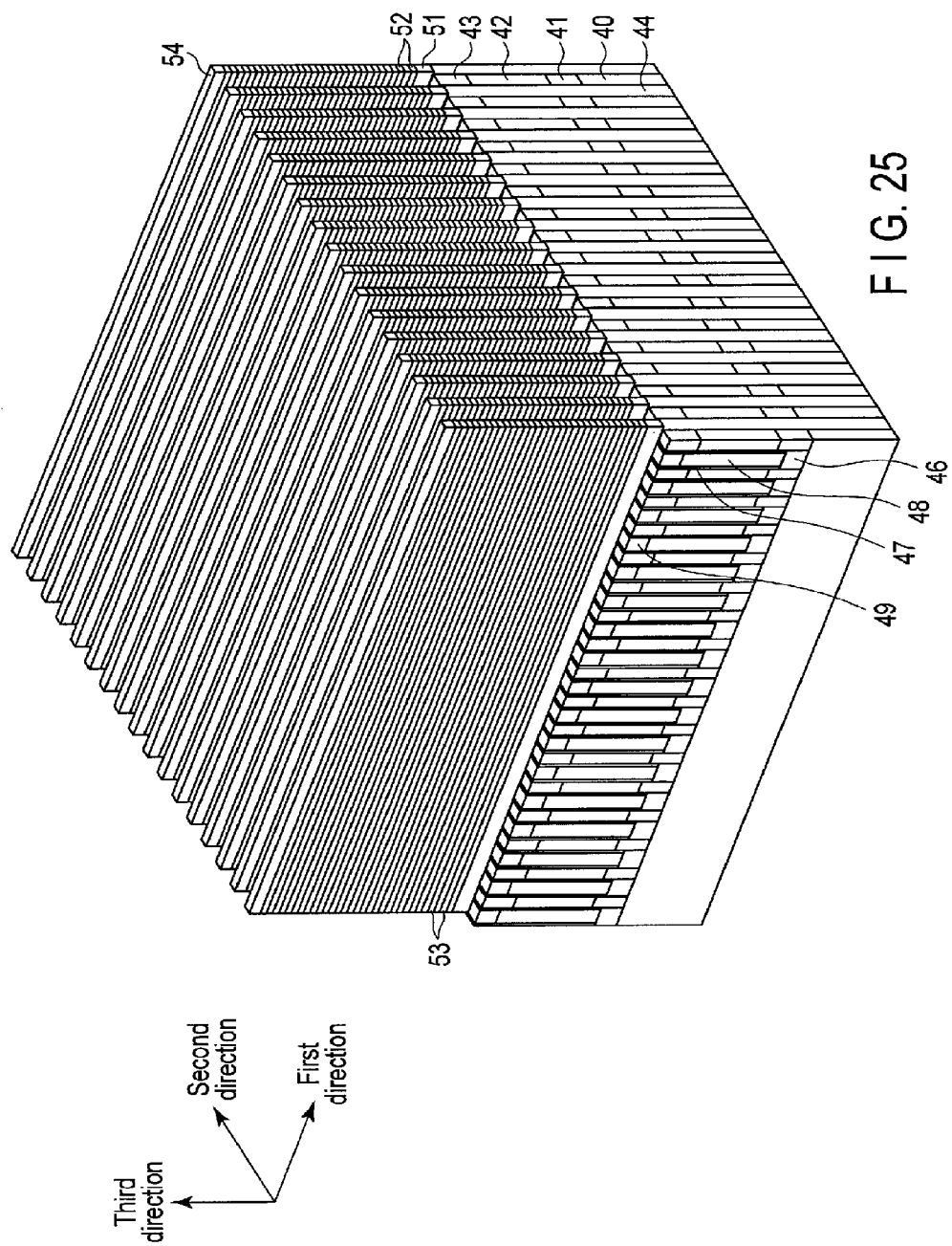
F I G. 25

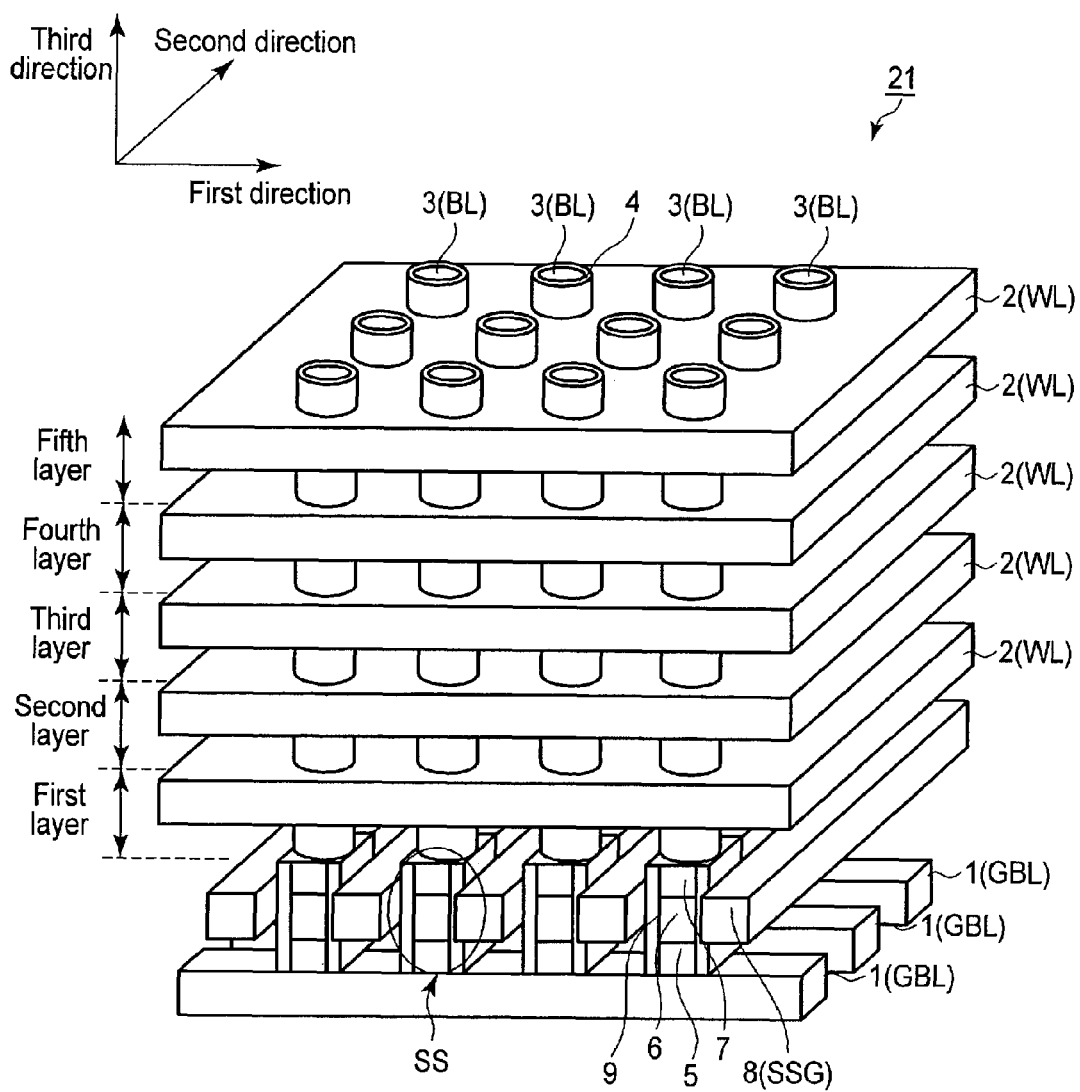
F I G. 29

THREE DIMENSIONAL MEMORY DEVICE INCLUDING MEMORY CELLS WITH RESISTANCE CHANGE LAYERS

CROSS REFERENCE TO RELATED APPLICATIONS

This application claims the benefit of U.S. Provisional Application No. 62/130,947, filed Mar. 10, 2015, the entire contents of which are incorporated herein by reference.

FIELD

Embodiments described herein relate generally to a memory device.

BACKGROUND

In recent years, memories referred to as ReRAMs (Resistive RAMS) have been proposed in which memory cells include a non-ohmic element typified by a diode and a resistance change material. The memory cells in the ReRAM do not use MOSFETs. Therefore, the ReRAM is expected to enable integration that is more advanced than conventional, mainstream integration.

BRIEF DESCRIPTION OF THE DRAWINGS

FIG. 1 is a perspective view of a memory cell array according to a first embodiment;

FIG. 2 is a cross-sectional view of a memory cell according to the first embodiment;

FIG. 3 to FIG. 5 are plan views of the memory cell array according to the first embodiment;

FIG. 7 is a block diagram of a memory device according to the first embodiment;

FIG. 8 is a circuit diagram of the memory cell array according to the first embodiment;

FIG. 9 is a diagram of the appearance of the memory device according to the first embodiment;

FIG. 10 is a diagram illustrating biases applied when the memory device according to the first embodiment is in operation;

FIG. 11 is a cross-sectional view of the memory cell array according to the first embodiment;

FIG. 12 is a plan view of the memory cell according to the first embodiment;

FIG. 13 is a plan view of a sheet selector according to the first embodiment;

FIG. 14 to FIG. 16 are plan views of a memory cell array according to a modification of the first embodiment;

FIG. 17 to FIG. 28 are perspective views sequentially illustrating steps of manufacturing a memory device according to a second embodiment;

FIG. 29 is a perspective view of a memory cell array according to a third embodiment.

DETAILED DESCRIPTION

Figure 4:
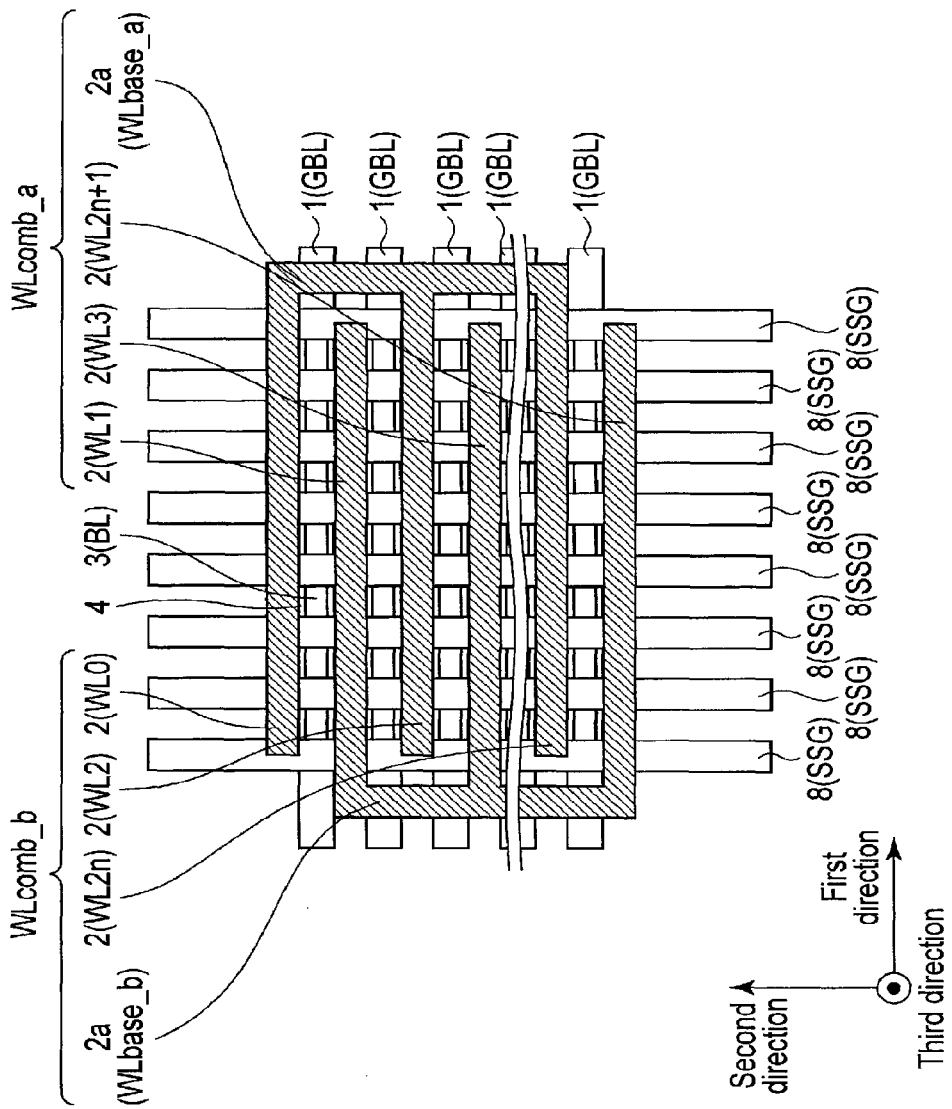

In general, according to one embodiment, a memory device includes a plurality of first interconnects each provided along a first direction;

a plurality of second interconnects each provided along the first direction;

a plurality of third interconnects each provided along a third direction that is different from the first direction;

memory cells each with resistance change layers provided on two side surfaces of a corresponding one of the third interconnects which surfaces are opposite to each other in a second direction different from the first direction and the third direction, the resistance change layers being connected to the different second interconnects; and a plurality of selectors configured to connect the third interconnects to the first interconnects, wherein one of the selectors includes a semiconductor layer provided between the corresponding third interconnect and the corresponding first interconnect, and gates provided, via a gate insulating film, on two side surfaces that are opposite to each other in the first direction.

Embodiments will be described with reference to the drawings. In the description below, components with substantially the same functions and configurations are denoted by the same reference numerals, and duplicate descriptions will be given only when needed. Furthermore, the embodiments disclosed below illustrate apparatuses and methods for embodying technical concepts of the embodiments, and the technical concepts of the embodiments are not intended to limit the materials, shapes, structures, arrangements, and the like of the components to those which are described below. Various changes may be made to the technical concepts of the embodiments within the scope of the claims.

<1> First Embodiment

A memory device according to a first embodiment will be described taking an ReRAM as an example.

<1-1> Configuration of the Memory Cell Array

First, a memory cell array 21 according to the first embodiment will be described using FIG. 1. To make the configuration of the memory cell array 21 easily understood, representation of interlayer insulating films and the like provided between the components described below is omitted.

As depicted in FIG. 1, a plurality of global column lines 1, a plurality of row lines 2, and a plurality of column lines 3 are provided in the memory cell array 21. The plurality of global lines 1 are arranged such that each of the global column lines 1 extends in a first direction and that the global column lines 1 lie parallel to one another along a second direction orthogonal to the first direction and in a lowermost layer of the memory cell array 21. The plurality of row lines 2 are arranged such that each of the row lines 2 extends in the first direction and that the row lines 2 lie parallel to one another along the second direction and at a higher position than the global column lines 1. Layers of the plurality of row lines 2 (a first layer, a second layer, a third layer, . . . , in FIG. 1) are arranged parallel to one another along a third direction (a normal direction of a plane in which the global column lines 1 are arranged) orthogonal to both the first direction and the second direction. The plurality of column lines 3 are arranged such that each of the column lines 3 extends in the third direction and that the column lines lie between the row lines 2. One end (lower end) of each of the column lines 3 is electrically connectable to one of the global column lines 1. More specifically, the column lines 3 arranged in the same line along the first direction are electrically connectable to the same global column line 1.

In the present example, a resistance change material 4 is provided all over side surfaces of each of the column lines 3 (surfaces that are opposite to the row lines 2) to function as a memory cell MC. In other words, the memory cell MC with a resistance change element is arranged between each of the row lines 2 and each of the column lines 3. The resistance change material 4 in the present example is provided on two side surfaces that are opposite to each other in the second direction (two side surfaces opposite to the respective row lines 2) among the two sets of opposite side surfaces of each of the column lines 3, and is not provided on two side surfaces that are opposite to each other in the first direction (two side surfaces not opposite to the respective row lines 2).

A select element (sheet selector) SS is provided between each of the global column lines 1 and each of the corresponding column lines 3. More specifically, a source area 5, a channel area 6, and a drain area 7 providing the select element SS are sequentially stacked on one global column line 1. On a side surface of this stack structure, a gate insulating film 9 is provided. Furthermore, a select gate line 8 (SSG) is provided between the channel areas 6 that are adjacent to each other in the first direction. The source area 5, the channel area 6, the drain area 7, the gate insulating film 9, and the select gate line 8 (SSG) provide a MOS transistor serving as the select element SS. That is, the select element SS includes, for one set of the source area 5, the channel area 6, and the drain area 7, two gates connected to the different select gate lines (SSG). In other words, two MOS transistors are provided for one bit line BL. Furthermore, the two MOS transistors share the source area 5, the channel area 6, and the drain area 7. Gates of the two MOS transistors are connected to the different select gate lines (SSG). Additionally, the select elements SS that are associated with different bit lines BL and that are adjacent to each other in the first direction share the gate (select gate line SSG).

The global column lines 1, the row lines 2, and the column lines 3 are hereinafter referred to as global bit lines GBL, word lines WL, and bit lines BL, respectively, as is the case with standard memory cells with MOS transistors.

<1-2> Memory Cell

FIG. 2 is a cross-sectional view of the memory cell array and an equivalent circuit of a partial area of the memory cell array. FIG. 2 depicts the structure of a partial area in a plane defined by the second direction and the third direction in FIG. 1. As depicted in FIG. 2, the resistance change materials 4 functioning as memory cells MC are provided on the side surfaces of the bit line BL. Moreover, the word line WL is provided in an area between the bit lines BL adjacent to each other in the second direction. Furthermore, the resistance change material 4 is provided in contact with the bit line EL and the word line WL. In other words, the memory cells MC each including the resistance change material 4 provided between the word line WL and the bit line BL are arranged, for example, in a three-dimensional matrix in the memory cell array. In the present structure, the word lines WL and the bit lines BL are in a simple line and space pattern. The word lines WL and the bit lines BL may be in a positional relation in which the word lines WL are orthogonal to the bit lines BL, and misalignment in a word line direction and in a bit line direction need not be taken into account. Therefore, alignment accuracy needed for the inside of the memory cell at the time of manufacturing may be very low, allowing the manufacturing to be easily achieved. This structure is a high integration structure that enables 1-bit information to be stored in a $2F^2$ area.

The resistance change material 4 is formed using, for example, HfO as a material. The resistance change material 4, typified by HfO, is a raw material that transits between at least two resistance values for a low resistance state (LRS) and a high resistance state (HRS). The resistance change material in the high resistance state transits to the low resistance state when a certain voltage or higher is applied to the resistance change material. The resistance change material in the low resistance state transits to the high resistance state when a certain current or higher flows in the resistance change material. In particular, a resistance change material for which the transition from the high resistance state to the low resistance state and the transition from the low resistance state to the high resistance state are achieved by application of voltages of different polarities is referred to as a bipolar operating element. The resistance change material 4 performing such an operation may be formed of a thin film containing, besides HfO, at least one of materials such as $TiO_2$, $ZnMn_2O_4$, NiO, $SrZrO_3$, and $Pr_{0.7}Ca_{0.3}MNO_3$, and carbon.

<1-3> Configuration of the Word Line WL

Now, a configuration of the word line WL will be described using FIGS. 3 and 4.

FIG. 3 is a diagram depicting a pattern of the word lines WL in one of the plurality of layers in FIG. 1. FIG. 4 is a plan view schematically depicting a part of the memory cell in a block 10 in FIG. 3.

As depicted in FIG. 3, a memory cell array 21 includes a plurality of unit arrays 10 and a plurality of hook up areas 11 each provided adjacently to the corresponding unit array 10 in the second direction. The unit array 10 is hereinafter referred to as a block BLK. The hook up area 11 is an area where a interconnect such as the select gate line SSG or the word line WL is connected to a peripheral circuit such as a decoder.

As depicted in FIGS. 3 and 4, two word line groups WLcomb_a0 and WLcomb_b0 each with a comb shaped structure are arranged in a block BLK0_0. Furthermore, two word line groups WLcomb_a1 and WLcomb_b0 each with a comb shaped structure are arranged in a block BLK0_1. Additionally, two word line groups WLcomb_a1 and WLcomb_b1 each with a comb shaped structure are arranged in a block BLK0_2. In addition, two word line groups WLcomb_a2 and WLcomb_b1 each with a comb shaped structure are arranged in a block BLK0_3. In other words, two word line groups WLcomb_a and WLcomb_b each with a comb shaped structure are arranged in one block BLK.

When the word line groups WLcomb_a0, WLcomb_a1, WLcomb_a2, . . . , are not distinguished from one another, these word line groups are simply referred to as a word line group WLcomb_a. Furthermore, when the word line groups WLcomb_b0, WLcomb_b1, WLcomb_b2, . . . , are not distinguished from one another, these word line groups are simply referred to as a word line group WLcomb_b. Additionally, when the word line group WLcomb_a and the word line group WLcomb_b are not distinguished from each other, these word line groups are simply referred to as a word line group WLcomb.

The word line group WLcomb includes an area 2a along the second direction (interconnect) and an area 2 along the first direction (word line WL). The area 2a is hereinafter referred to as a base interconnect WLbase. A plurality of word lines WL are connected to the base interconnect WLbase. In other words, each of the word lines along the first direction belongs to one of the word line groups WLcomb. Specifically, in a predetermined block BLK, odd-numbered word lines WL1, WL3, . . . , WL2$n$+1 ($n$ is a natural number) are connected to the same base interconnect WLbase_a. Furthermore, in the predetermined block BLK, even-numbered word lines WL0, WL2, . . . , WL2$n$ are connected to the same base interconnect WLbase_b.

In the predetermined block BLK, the odd-numbered word lines are electrically separated from the even-numbered word lines.

In other words, in one block BLK, 2$n$+2 word lines WL each belong to one of the two word line groups WLcomb_a and WLcomb_b as depicted in FIGS. 3 and 4. Each of the word lines belonging to the word line group WLcomb_a is sandwiched between any two word lines WL belonging to the other word line group WLcomb_b in the second direction.

Furthermore, as depicted in FIG. 3, the word lines WL0 to WL2$n$ in the block BLK0_0 and the word lines WL1 to WL2$n$+1 in the block BLK0_1 belong to the word line group WLcomb_b0. In other words, the word lines WL0 to WL2$n$ in the block BLK0_0 and the word lines WL1 to WL2$n$+1 in the block BLK0_1 are connected to the base interconnect WLbase_b0. The base interconnect WLbase_b0 is provided in a boundary area between the block BLK0_0 and the block BLK0_1.

The word lines WL0 to WL2$n$ in the block BLK0_1 and the word lines WL1 to WL2$n$+1 in the block BLK0_2 belong to the word line group WLcomb_a1. In other words, the word lines WL0 to WL2$n$ in the block BLK0_1 and the word lines WL1 to WL2$n$+1 in the block BLK0_2 are connected to the base interconnect WLbase_a1. The base interconnect WLbase_a1 is provided in a boundary area between the block BLK0_1 and the block BLK0_2.

As described above, according to the present embodiment, the word line group WLcomb is provided to extend across two adjacent blocks in the first direction.

Figure 5:
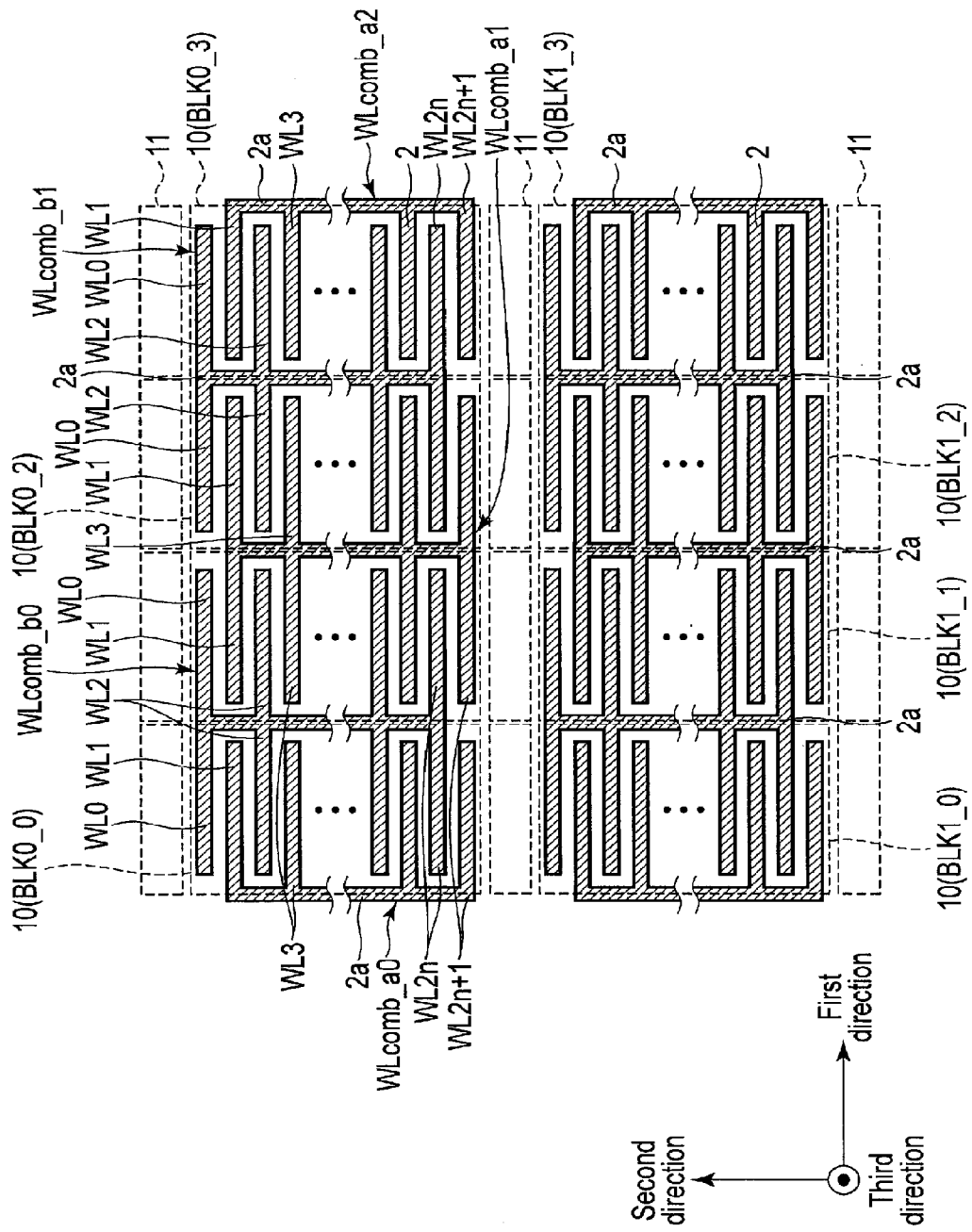

An example of the shape of the word line group WLcomb has been illustrated using FIGS. 3 and 4. However, the shape of the word line group WLcomb is not limited to this. For example, such a configuration as depicted in FIG. 5 may be provided. Specifically, the word lines WL0 to WL2$n$ in the block BLK0_0 and the word lines WL0 to WL2$n$ in the block BLK0_1 belong to the word line group WLcomb_b0. Furthermore, the word lines WL1 to WL2$n$+1 in the block BLK0_1 and the word lines WL1 to WL2$n$+1 in the block BLK0_2 belong to the word line group WLcomb_a1. In this manner, the shape of the word line group WLcomb can be changed as needed.

Figure 6:
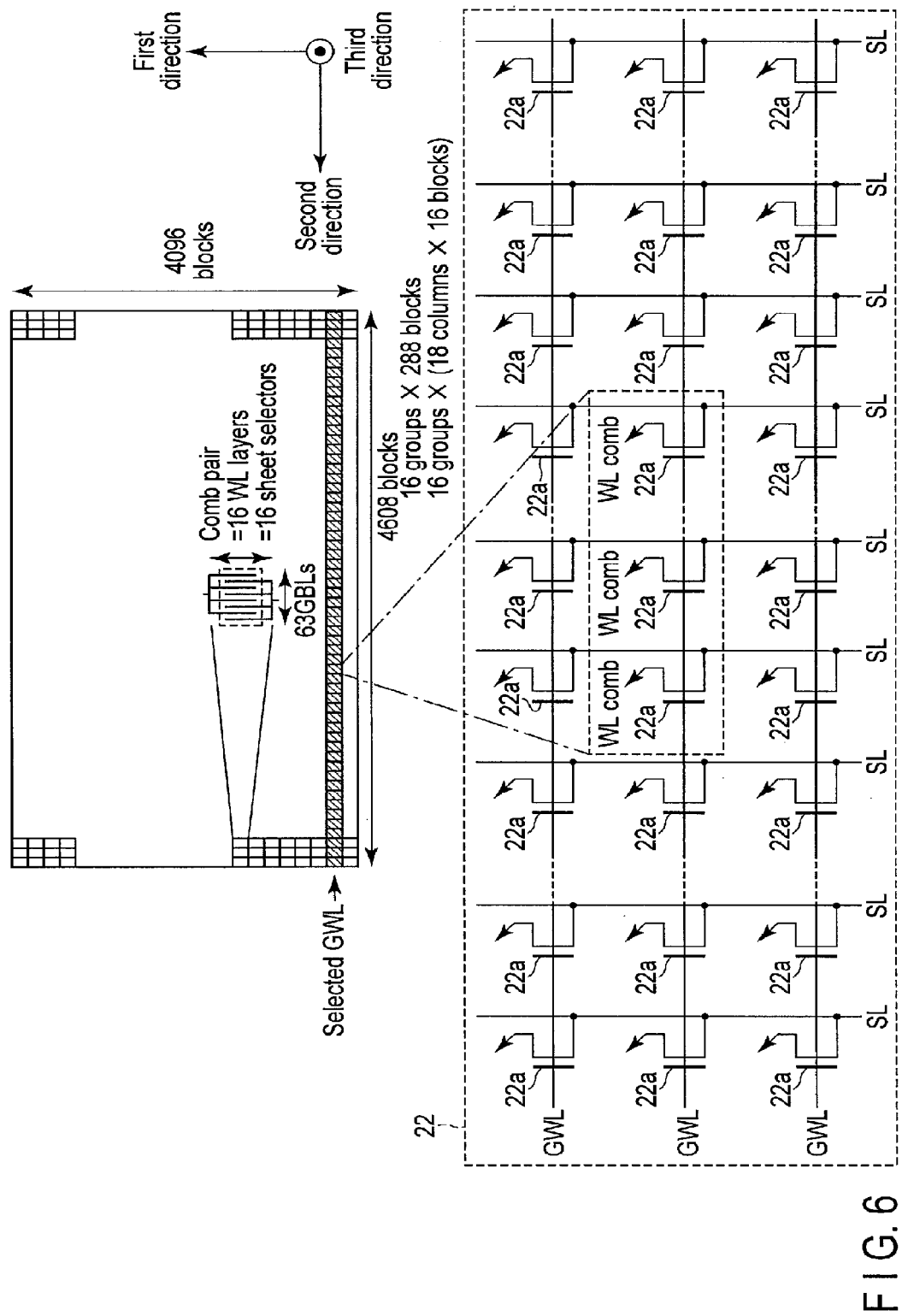
FIG. 6 is a block diagram of the memory cell array according to the first embodiment.

Now, a configuration example of the memory cell array according to the present embodiment will be described using FIG. 6. As depicted in FIG. 6, the memory cell array 21 includes a plurality of blocks BLK. Each block BLK includes a set of word line groups WLcomb. Furthermore, in an example in FIG. 6, one block BLK includes, for example, 63 global bit lines GBL. One block BLK includes, for example, 64 word lines WL. Additionally, the number of layers of the word lines WL is, for example, 16. The memory cell array 21 is formed by arranging, for example, 4096 blocks BLK in the vertical direction and 4608 blocks BLK in the horizontal direction.

In the example illustrated in FIG. 6, one block includes 63 global lines GBL. However, the present embodiment is not limited to this, and various changes may be made to this configuration. Furthermore, in the present embodiment, the number of layers of the word lines is 16. However, the present embodiment is not limited to this, and various changes may be made to the number. Moreover, in the present embodiment, the memory cell array 21 includes 4096×4608 blocks BLK. However, the present embodiment is not limited to this, and various changes may be made to the arrangement.

Furthermore, as depicted in FIG. 6, a word line decoder 22 includes a plurality of word line select transistors 22$a$. A gate of the word line select transistor 22$a$ receives an input through a global word line GWL. A source line SL is connected to a source or a drain of the word line select transistor 22$a$. The word line group WLcomb is connected to the drain or source of the word line select transistor 22$a$.

The word line decoder 22 selects one of the global word lines GWL and one of the source lines SL based on a WL address received from a controller 25. The word line select transistor 22$a$ is turned on based on the selected global word line GWL, and a select voltage is applied to the selected source line SL to select the word line group WLcomb.

<1-4> General Configuration of the Semiconductor Memory Device

Now, a general configuration of a semiconductor memory device according to the present embodiment will be described using FIG. 7. FIG. 7 is a block diagram of the semiconductor memory device according to the present embodiment.

As depicted in FIG. 7, a semiconductor memory device 20 includes the memory cell array 21, the word line decoder (WL decoder) 22, a global bit line decoder (GBL decoder) 23, a selector decoder 24, a controller 25, and a power supply 26.

The memory cell array 21 has the configuration described with reference to FIG. 1 and FIG. 2. FIG. 8 is an equivalent circuit diagram of the memory cell array 21. As depicted in FIG. 8, the memory cells MC each with a variable resistive element (resistance change material 4 in FIGS. 1 and 2) are arranged in a matrix in the memory cell array 21. In the memory cell MC, one end of the variable resistive element is connected to one of the bit lines BL (BL0, BL1, . . . ), and another end of the variable resistive element is connected to one of the word line groups WLcomb (WLcomb_a, WLcomb_b). In FIG. 8, the word line groups WLcomb_a and WLcomb_b are designated as WLcomb_a0_$i$ and WLcomb_b0_$i$, respectively, and "$i$" in the reference characters indicates the number of a layer in which the word line group is provided ("$i$" indicates in what layer the word line group is provided, and $i=1$ is indicative of the first layer, $i=2$ is indicative of the second layer, and so on). Furthermore, each of the bit lines is connected to the corresponding global bit line GBL via the corresponding select element SS (SS0, SS1, SS2, . . . ). Moreover, the gates of the adjacent select elements SS are connected to a common select gate line SSG$j$ ($j$ is a natural number). The select element SS may be considered to be a set of two MOS transistors TR1 and TR2 connected in parallel and having a common source and a common drain. The transistor TR1 in a certain select element SS shares a gate with the transistor TR2 in an adjacent select element SS. The transistor TR2 in the certain select element SS shares a gate with the transistor TR1 in another adjacent select element SS. However, the endmost select element includes only one of the transistors TR1 and TR2.

The three-dimensional memory cell array in FIG. 1 includes a plurality of the configurations in FIG. 8. That is, FIG. 8 corresponds to a memory cell arrangement included in a two-dimensional plane defined by the first direction and the third direction. A plurality of the memory cell arrangements are arranged along the second direction. In this case, between a plurality of such memory cell arrangements as depicted in FIG. 8, the select gate lines SSGj are connected together. Furthermore, between a plurality of such memory cell arrangements as depicted in FIG. 8, the word lines WLcomb_a0_$i$ are separated from each other, the word lines WLcomb_b0_$i$ are separated from each other, the bit lines BL are separated from each other, and the global bit lines GBL are separated from each other.

The description of the memory cell array will be continued with reference back to FIG. 7. The WL decoder 22 includes a word line selecting section and a word line driver. The word line selecting section selects from the word lines WL based on a WL address received from the controller 25. Then, the word line driver applies voltages needed for data read, write, and erase to a selected word line and unselected word lines.

The GBL decoder 23 includes a global bit line selecting section and a global bit line driver. The global bit line selecting section selects from the global bit lines GBL based on a column address received from the controller 25. Then, the global bit line driver applies voltages needed for data read, write, and erase to a selected global bit line and unselected global bit lines.

The selector decoder 24 includes a selector selecting section and a select gate line driver. The selector selecting section selects from the select gate lines SSG based on a sheet address received from the controller 25. Then, the selected gate line driver applies voltages needed for data read, write, and erase to a selected select gate line and unselected select gate lines.

The "sheet" refers to a set of memory cells selected by one of the select gate lines. In other words, the sheet is a set of memory cells within a plane defined by the second direction and the third direction in FIG. 1.

The controller 25 controls operations of the semiconductor memory device as a whole. Furthermore, the controller 25 transmits addresses needed as described above to the WL decoder 22, the GBL decoder 23, and the selector decoder 24. Additionally, at the time of data write, the controller 25 instructs the WL decoder 22, the GBL decoder 23, and the selector decoder 24 to apply a needed voltage to the selected memory cell MC in order to change the resistance state of the variable resistive element of the memory cell MC. In addition, at the time of data read, the controller 25 instructs the WL decoder 22, the GBL decoder 23, and the selector decoder 24 to apply a needed voltage to the selected memory cell MC in order to detect a resistance value for the variable resistive element of the memory cell MC as a storage state of the memory cell MC. Moreover, the controller 25 includes a sense amplifier not depicted in the drawings, and the sense amplifier senses and amplifies data read on the global bit line GBL.

The power supply 26 generates a predetermined voltage set needed for data read, write, and erase. Voltages generated by the power supply 26 are provided to the word lines WL and the bit lines BL. For example, at the time of data write, a large potential difference is generated between the selected word line and the selected bit line to allow transition of the resistance state of the variable resistive element. Furthermore, at the time of data read, a potential difference is generated between the selected word line and the selected bit line to the extent that the resistance state does not change, and a current flowing through the bit line or the word line is detected.

FIG. 9 is a diagram of the appearance of the semiconductor memory device according to the present embodiment. As depicted in FIG. 9, a CMOS circuit 32 with a wiring layer from a process normally used is provided on a silicon substrate 31. A layer 33 with a plurality of memory cell sections 34 is provided on the CMOS circuit 32. The individual memory cell sections 34 depicted in FIG. 9 correspond to the memory cell array 21 in FIG. 1, and wiring for the memory cell sections 24 is provided in accordance with, for example, a 24-nm design rule. Furthermore, a section including the decoders 22 to 24 and the controller 25 in FIG. 7 and referred to as a peripheral circuit in a normal memory is included in the CMOS circuit 32 in FIG. 9.

The CMOS circuit 32 may be designed and produced, except for a connection between the CMOS circuit 32 and the memory cell section 34, in accordance with, for example, a 90-nm design rule that is looser than the design rule for the memory cell section 34. The layer 33 includes an electric connection with the CMOS circuit 32 around each of the memory cell sections 34. Blocks each with the memory cell section 34 and the peripheral connection are arranged in a matrix. Moreover, I/O sections 35 of the present apparatus are provided at ends of the layer 33. The I/O section 35 includes a terminal with an electric coupling to an I/O section of the CMOS circuit 32 via a through-hole.

Such a configuration allows insulating films provided in the memory cell sections 34 to accomplish a function corresponding to a protection film for the CMOS circuit 32. On the other hand, the memory cell sections 34 are coupled to the CMOS circuit 32 in a direction perpendicular to a substrate surface. This enables a reduction in operating time and a substantial increase in the number of cells on which reading or writing can be performed at the same time without an increase in chip area. The I/O section 35 of the apparatus is bonded to a lead frame during packaging steps as is the case with normal semiconductor devices.

<1-5> Operations

Now, operations of the semiconductor memory device according to the present embodiment will be described. FIG. 10 illustrates the bias states of signal lines observed while the semiconductor memory device according to the present embodiment is in operation as an example. Furthermore, FIG. 11 is a cross-sectional view of the memory cell array, depicting a plane formed by the first direction and the third direction in FIG. 1.

In the description below, a selected global bit line is labeled as "GBL_s", and unselected global bit lines are labeled as "GBL_u". Furthermore, a selected word line is labeled as "WL_s", and unselected word lines are labeled as "WL_u". Moreover, on the select gate lines SSG, two select elements SS corresponding to the bit lines BL to which the selected memory cells MC are connected are selected and labeled as SSG_s and SSG_n. The other select gate lines are unselected and labeled as SSG_u.

<1-5-1> Write Operation

First, a write operation of storing information in a memory cell will be described.

During a write operation, the GBL decoder 23 applies a write voltage Vw (>0 V) to a selected global bit line GBL_s, while applying a half of the write voltage (Vw/2) to unselected global bit lines GBL_u.

Furthermore, the WL decoder 22 applies 0 V to a selected word line WL_s, while applying (Vw/2) to unselected word lines WL_u.

Moreover, the selector decoder 24 applies a write gate voltage Vg_w (>0 V) to both two select gate lines SSG_s and SSG_n, while applying 0 V to the other select gate lines SSG_u.

As a result, for the select element SS connected to the selected gate line BL, the two select gate lines SSG_s and SSG_n form a channel to transfer a write voltage Vw to the selected memory cell MC through the selected global bit line GBL_s. On the other hand, 0 V is transferred to the selected memory cell MC through the selected word line WL_s. Thus, a potential difference of Vw is applied between the opposite ends of the variable resistive element of the memory cell to write data to the memory cell MC.

<1-5-2> Erase Operation

Now, an operation of erasing information held in the memory cell MC will be described with continued reference to FIG. 10 and FIG. 11.

During an erase operation, with the bipolar operation of the elements taken into account, the WL decoder 22 applies a voltage (Ve+1) equal to an erase voltage Ve plus an offset voltage of 1 V to the selected word line WL_s, while applying a voltage ((Ve/2)+1) to the unselected word lines WL_u.

Furthermore, the GBL decoder 23 applies the offset voltage of 1 V to the selected global bit line GBL_s, while applying the voltage ((Ve/2)+1) to the unselected global bit lines GBL_u.

Moreover, the selector decoder 24 applies an erase gate voltage Vg_e to both the select gate lines SSG_s and SSG_n, while applying 0 V to the other select gate lines SSG_u.

As a result, the voltage Ve is transferred to the selected memory cell MC as described for the write operation. The potential difference of Ve is applied between the opposite ends of the variable resistive element to erase the data.

<1-5-3> Read Operation

Now, an operation of reading information from the memory cell will be described with continued reference to FIG. 10 and FIG. 11.

During a read operation, the GBL decoder 23 applies a voltage (Vr+Vo) equal to a read voltage Vr plus an offset voltage Vo to the selected global bit line GBL_s and the unselected global bit lines GBL_u.

Furthermore, the WL decoder 22 applies the offset voltage Vo to the selected word line WL_s, while applying (Vr+Vo) to the unselected word lines WL_u.

Moreover, the selector decoder 24 applies a read gate voltage Vg_r to the select gate line SSG_s, while applying 0 V to the other select gate lines SSG_n and SSG_u.

As a result, the voltage Vr is transferred to the selected memory cell MC as described for the write operation. Then, a read current flowing through the selected memory cell MC is transferred to the selected global bit line GBL_s via the select element SS.

<1-6> Effect of the Present Embodiment

The configuration according to the present embodiment allows the degree of integration of the memory cell array to be improved. This effect will be described below in detail.

In recent years, with advanced integration of semiconductor devices, circuit patterns of LSI elements have been increasingly miniaturized. Miniaturization of the patterns needs not only a reduction in line width but also an increase in the dimensional and positional accuracies of the pattern. This also applies to memory devices. For the memory device, memory cells formed utilizing high-precision processing techniques need to hold a given amount of charge needed for storage in a narrower area.

Various memories such as DRAMs, SRAMs, and flash memories have been manufactured. All of these memories store data by holding a given amount of charge. Thus, with the miniaturization of the patterns, variations among memory cells and the like are tightly restricted. Consequently, a heavy burden is imposed on a lithography technique for forming these patterns, and this is a factor that increases the costs of lithography steps. The costs of the lithography steps represent a large portion of the current mass production costs. Thus, the burden on the lithography steps is a direct factor that increases product costs.

On the other hand, in recent years, memories referred to as ReRAMs (Resistive RAMS) have been proposed in which memory cells each include a non-ohmic element typified by a diode and a resistance change material. The ReRAM need not use MOSFETs for memory cells, and is thus expected to enable integration that is more advanced than the conventional mainstream type of integration. Moreover, the ReRAM is configured to allow easy three-dimensional stacking and thus expected to drastically increase the degree of integration compared to conventional memories utilizing only two-dimensional planes.

FIG. 12 is a plan view of the memory cell MC according to the present embodiment, corresponding to a plane defined by the first direction and the second direction. As depicted in FIG. 12, when the line width of the word line, the spacing between the word lines, and the width of the bit line BL along the second direction are formed in accordance with the minimum processing dimension F for a photolithography technique, the size of one memory cell MC is $2F^2$ in area with 2F in the vertical direction and F in the horizontal direction.

However, when a layered bit line structure is used in which a plurality of bit lines are connected to the global bit line, forming the memory cell such that the memory cell has a size of $2F^2$ is actually difficult. This is due to the select elements SS. The select elements SS are intended to switch the connection between the bit line BL and the global bit line GBL and are normally implemented by MOS transistors.

The select element SS is positioned immediately below the memory cell MC, and thus, when an attempt is made to form the memory cell such that the memory cell has a size of $2F^2$, the size of the select element SS correspondingly needs to be reduced. However, when the select element SS is provided using a normal planar MOS transistor, meeting this request is difficult.

However, in the present embodiment, the select element SS is provided by stacking the source area 5, the channel area 6, and the drain area 7 so that the areas have the same width as that of the bit line BL and providing the gate SSG on the side surface of the source area 5, the channel area 6, and the drain area 7. As a result, the size of the select element SS is $4F^2$ per bit line BL. This is illustrated in FIG. 13. FIG. 13 is a plan view of the select element SS according to the present embodiment, corresponding to a plane defined by the first direction and the second direction. As depicted in FIG. 13, the size of the select element SS is $4F^2$. The area occupied by the select element corresponds to an area in which two memory cells MC are arranged.

Reducing the size of the select element SS as described above also enables a reduction in the size of the memory cell MC and an increase in the degree of integration of the memory cell array.

Furthermore, the present embodiment allows operational reliability to be improved without the use of a negative voltage. This is because the offset voltage is used during the erase operation as described above. That is, due to the characteristics of the select element SS, leakage current to the unselected cells can be drastically reduced by setting the potential of GBL_s to a value larger than the value for GBL_u by approximately 1 V. In this case, setting a reference for bias to a positive potential 1 V apart from 0 V allows the use of a negative voltage to be avoided. The use of a negative voltage needs a circuit that generates the negative voltage, and it has a relatively large circuit area. However, the present embodiment enables a reduction in leakage current without the use of the negative voltage generating circuit, allowing the operational reliability of the semiconductor memory device to be improved. The offset voltage during the erase operation is not limited to 1 V and may be selected as needed according to demanded performance or the like.

Moreover, the present embodiment enables a reduction in power consumption and/or an increase in operating speed. This is due to the use of the offset voltage during the read operation as described above. Normally, immediately after writing or erasure is performed, reading is executed on the memory cell to check whether the memory cell has a desired resistance value. As a result, if the resistance value falls outside a desired range, additional writing or erasure is performed. Normally, a voltage needed for writing and for erasure is higher than a voltage needed for reading.

In this regard, the present embodiment sets the reference for the reading bias at the positive voltage Vo apart form 0 V. In other words, the value of the voltage used during reading is set close to the voltage used for writing and for erasure. Therefore, when the write operation or the erase operation shifts to the read operation or the read operation shifts to the write operation or the erase operation, a possible large voltage difference between the bias condition for the write or erase operation and the bias condition for the read operation can be prevented, and a change in the voltage of a node with a large parasitic capacitance can be reduced. Thus, an increase in unwanted power consumption and in operating time can be suppressed.

In the present embodiment, the global bit line GBL has the largest parasitic capacitance. Thus, the voltage applied to the global bit line GBL for the write or erase operation is desirably set as close to the voltage applied to the global bit line GBL for the read operation as possible.

More preferably, the number of unselected global bit lines is larger than the number of selected global bit lines. Thus, to prevent the potential of the unselected global bit line from varying significantly, the offset voltage Vo may be set such that (Vw/2) and (Vr+Vo) are approximately equal during the write operation and that ((Ve/2)+1) and (Vr+Vo) are approximately equal during the erase operation.

Normally, only one word line WL is selected for the memory cell array. However, a plurality of the global bit lines GBL may be selected at the same time. This increases the number of bits on which writing, erasure, or reading can be performed at the same time, enabling an increase in bandwidth.

<1-7> Modification of the First Embodiment

Figure 16:
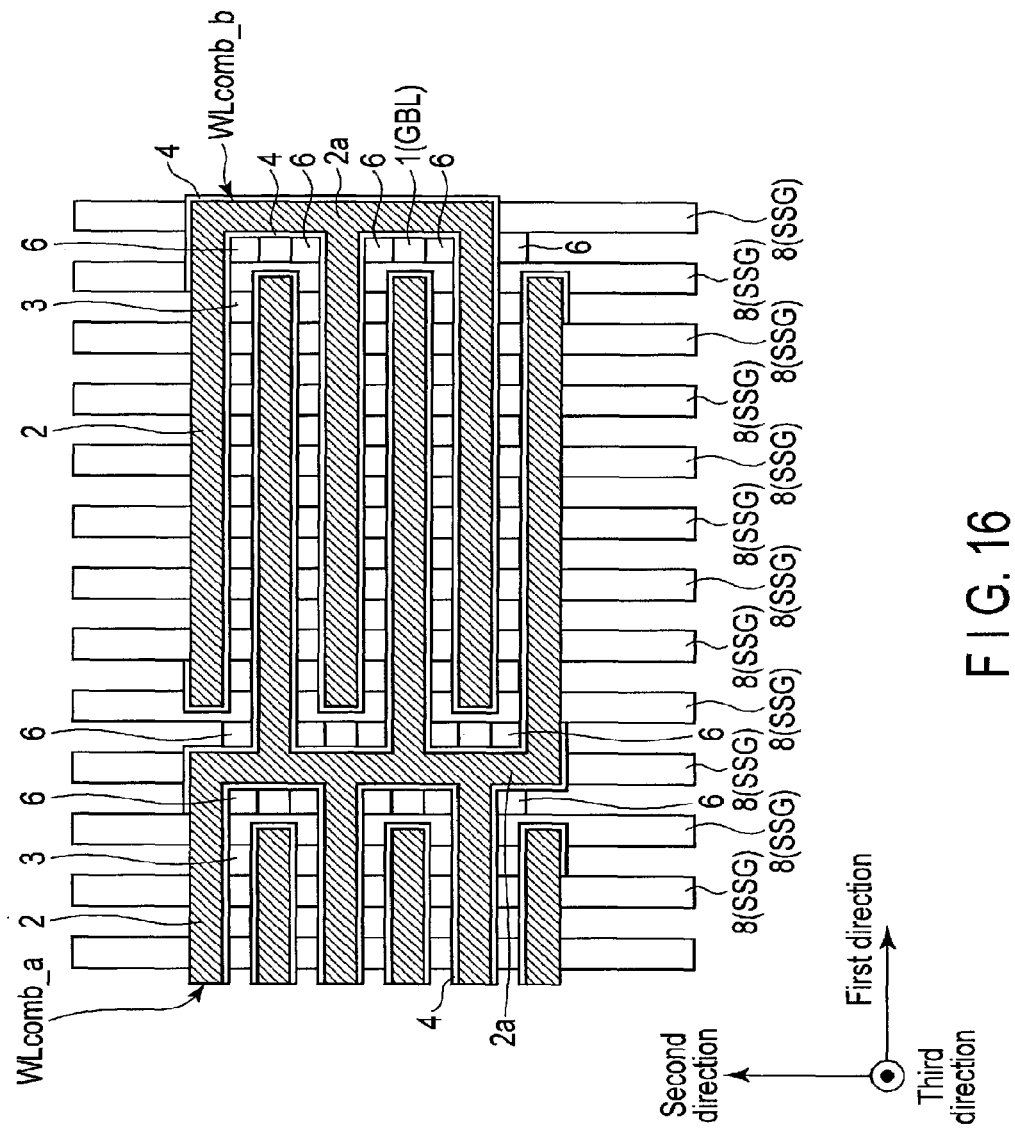

Now, a memory device according to modifications of the first embodiment will be described using FIGS. 14 to 16. The modifications of the first embodiment relate to structure examples of the memory cell array 21 described in the first embodiment. In FIGS. 14 to 16, to make the structure of the memory cell array 21 in the plane defined by the first direction and the second direction easily understood, representation of interlayer insulating films and the like is omitted.

<1-7-1> Structure Example 1

As depicted in FIG. 14, in a structure example 1 of the memory cell array 21, the base interconnect 2a of the word line groups WLcomb_a and WLcomb_b is provided so as to lie between the two select gate lines SSG adjacent to each other in the first direction and above the select gate lines SSG layer (closer to the reader than the select gate lines SSG in the sheet of FIG. 14).

<1-7-2> Structure Example 2

As depicted in FIG. 15, in a structure example 2 of the memory cell array 21, the base interconnect 2a of the word line group WLcomb_a or WLcomb_b is provided so as to lie on top of the select gate lines SSG (closer to the reader than the select gate lines SSG in the sheet of FIG. 15).

<1-7-3> Structure Example 3

As depicted in FIG. 16, in a structure example 3 of the memory cell array 21, the base interconnect 2a of the word line group WLcomb_a or WLcomb_b is provided so as to lie on top of the select gate lines SSG (closer to the reader than the select gate lines SSG in the sheet of FIG. 15). Furthermore, the resistance change material 4 is provided on the side surfaces of the word line group WLcomb_a or WLcomb_b.

As described above, the structure of the memory cell array 21 in the plane defined by the first direction and the second direction can be changed as needed to enable the effect described in the first embodiment to be produced. Furthermore, the structure of the memory cell array 21 in the plane defined by the first direction and the second direction is not limited to the above-described structures.

<2> Second Embodiment

A memory device according to a second embodiment will be described. The present embodiment relates to a method for manufacturing the ReRAM described in the first embodiment.

First, the method for manufacturing the ReRAM will be described using FIG. 17 to FIG. 28. FIG. 17 to FIG. 28 are perspective views sequentially illustrating the steps of manufacturing a memory cell array in the ReRAM described in the first embodiment.

First, for example, on a silicon substrate 31, a normal CMOS circuit 32 that controls operations of the ReRAM is formed, and an interlayer insulating film is formed on the silicon substrate 31 so that the CMOS circuit 32 is coated with the interlayer insulating film. FIG. 17 to FIG. 28 depict a structure positioned above the interlayer insulating film.

Figure 17:
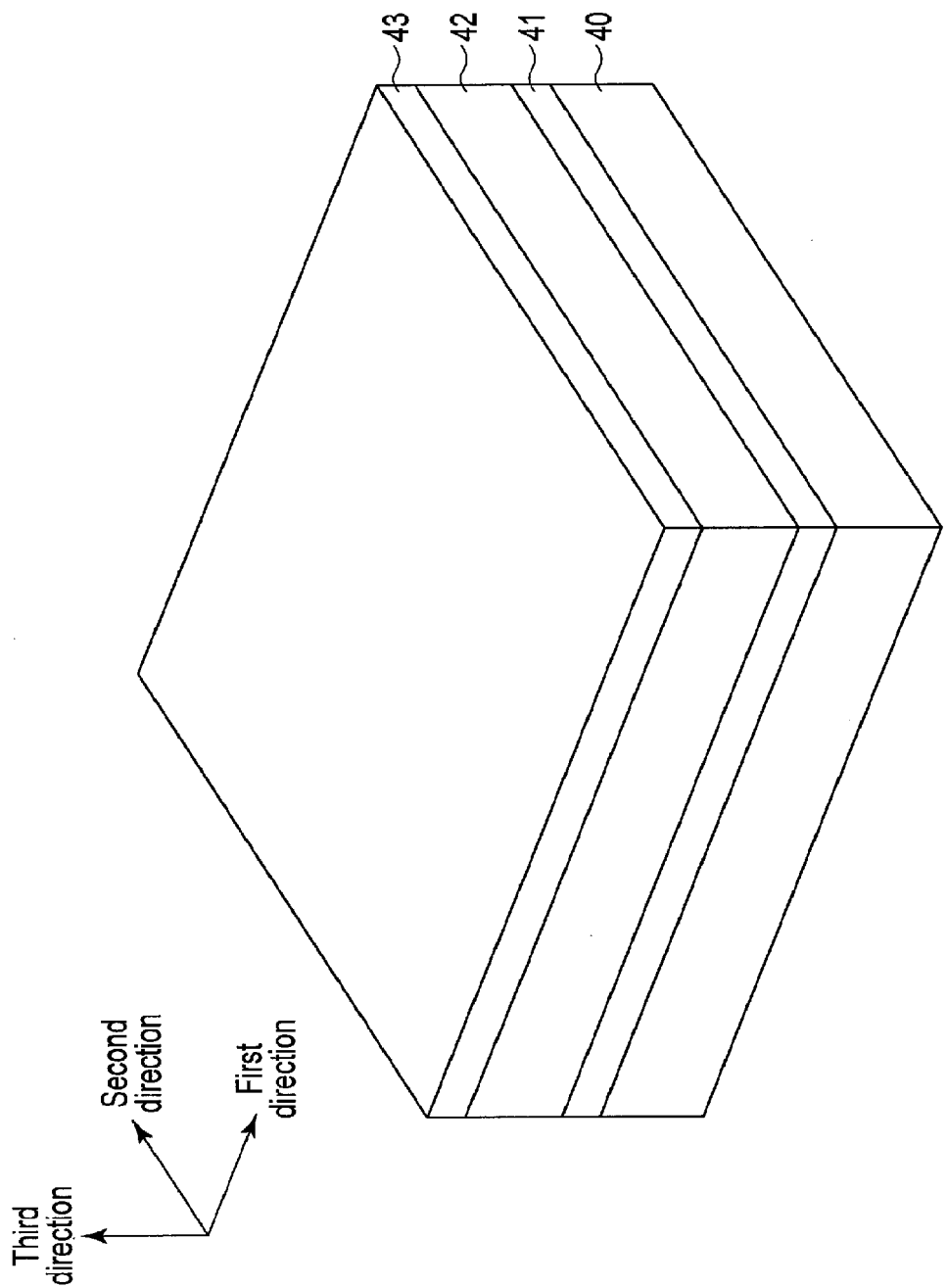

Then, as depicted in FIG. 17, a global bit line film 40 is formed on the interlayer insulating film not depicted in the drawings. The global bit line film 40 corresponds to the global bit line GBL described with reference to FIG. 1. By way of example, the global bit line film 40 is formed using, as a material, tungsten (W) and a TiN film serving as a barrier metal.

Subsequently, an n$^+$-type silicon layer 41, a p$^-$-type silicon layer 42, and an n$^+$-type silicon layer 43 are sequentially formed. The silicon layers 41 to 43 correspond to the source area 5, channel area 6, and drain area 7, respectively, described with reference to FIG. 1. The silicon layers 41, 43 have a dopant concentration of, for example, approximately $1 \times 10^{20}$ cm$^{-3}$ and a film thickness of approximately 40 nm. The silicon layer 42 has a dopant concentration of, for example, approximately $1 \times 10^{18}$ cm$^{-3}$ and a film thickness of approximately 120 nm. Then, annealing is performed under conditions of approximately 750° C. and 60 seconds to crystallize the silicon layers 41 to 43.

Figure 18:
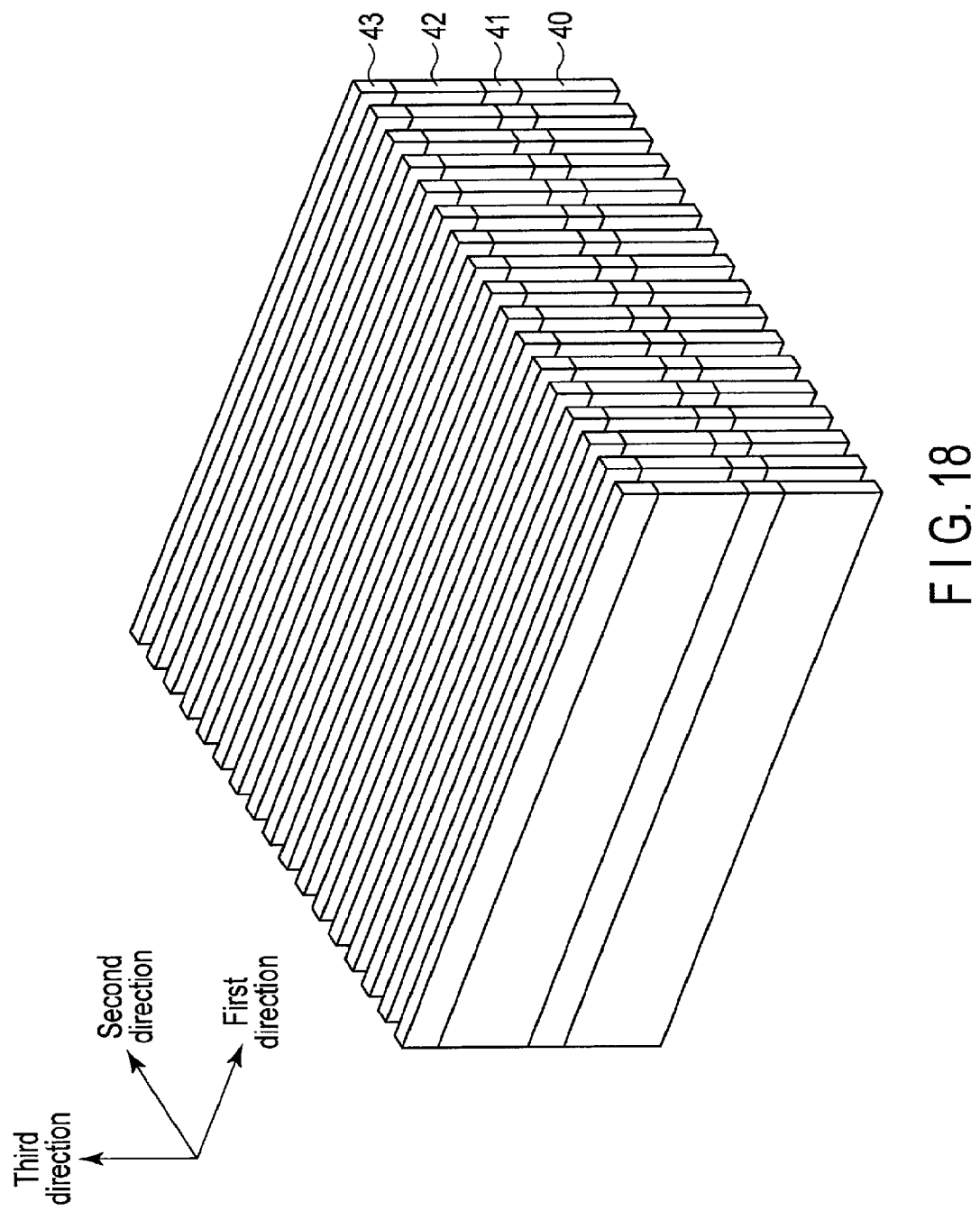

Then, as depicted in FIG. 18, the global bit line film 40 and the silicon layers 41 to 43 are patterned using the photolithography technique and an RIE (Reactive Ion Etching) technique. Thus, striped global bit lines 40 (GBL) along the first direction are formed. The line width of the global bit line GBL and the spacing between the global bit lines GBL are, for example, approximately 24 nm. The global bit line GBL has a film thickness of, for example, approximately 150 nm and a sheet resistance of, for example, approximately 1.5 ohm.

Subsequently, an interlayer insulating film 44 is formed all over the silicon layer. Then, the interlayer insulating film 44 is polished using a CMP method or the like to expose an upper surface of the silicon layer 43. In the present step, the area between the sets each of the global bit line film 40 and the silicon layers 41 to 43 which sets are adjacent to each other in the second direction is filled with the interlayer insulating film 44.

Figure 19:
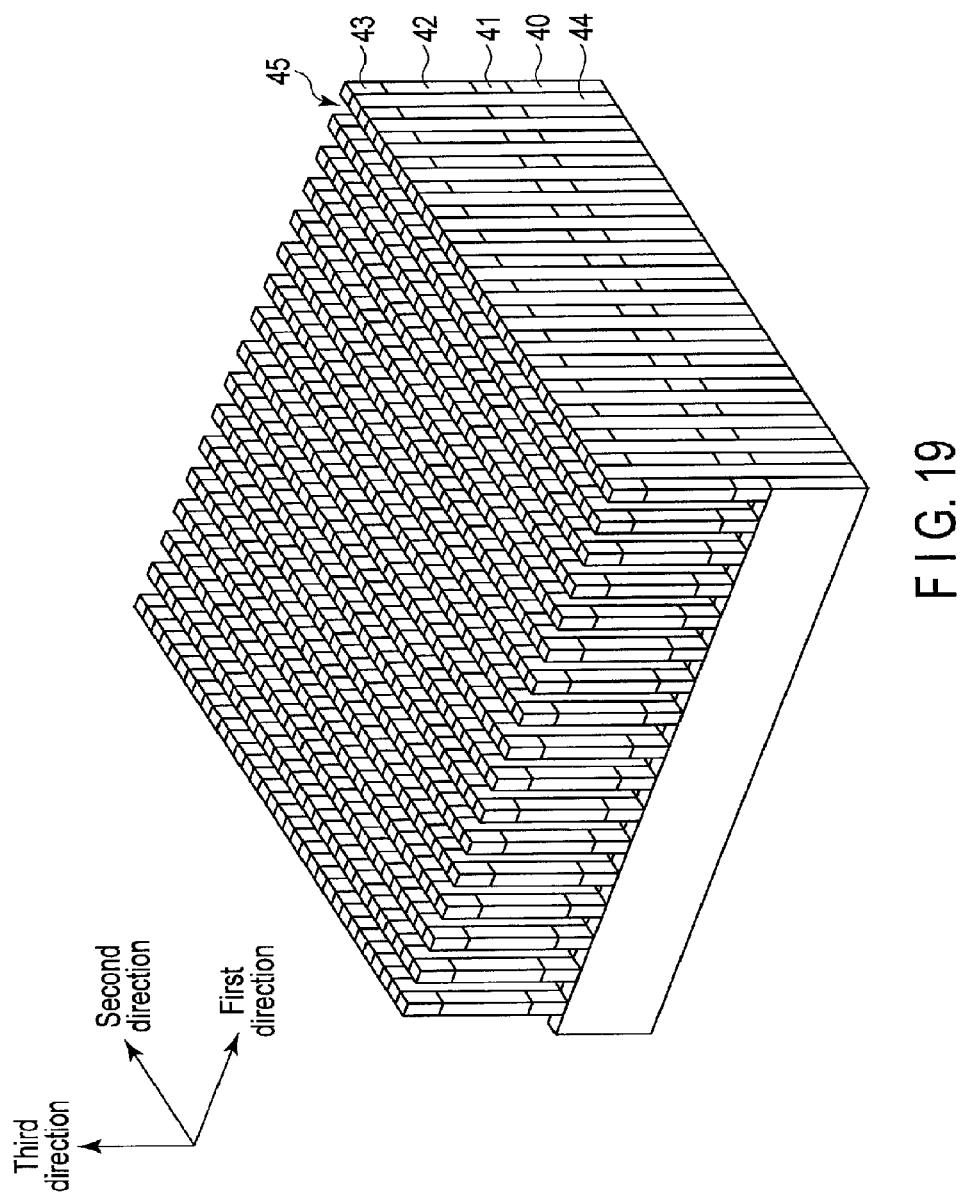

Then, as depicted in FIG. 19, the silicon layers 41 to 43 are patterned into a stripe shape along the second direction using the photolithography technique and the RIE technique. This patterning step is executed under conditions of, for example, a line width of approximately 19 nm and an inter-line spacing of approximately 29 nm (half pitch: 24 nm). The global bit line film 40 is exposed at the bottom of a groove formed in the present step.

Figure 20:
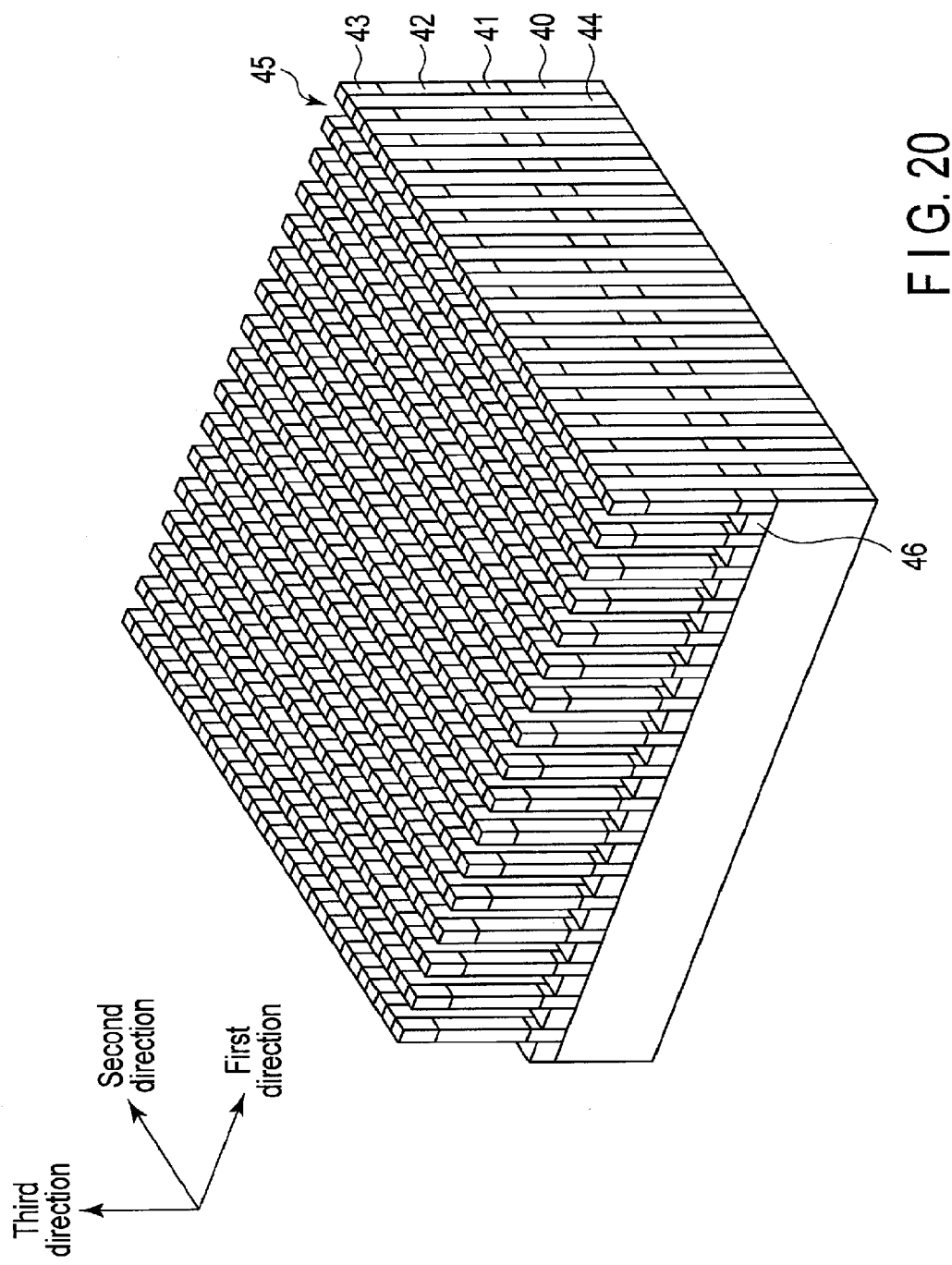

Then, an insulating film 46 (for example, a silicon oxide film) is formed all over the structure. The insulating film 46 is etched back so as to remain only at the bottom of the groove 45 as depicted in FIG. 20. The remaining insulating film 46 has a film thickness of, for example, approximately 30 nm. Hence, inside the groove 45, a part of the side surface of the silicon layer 41 and the side surfaces of the silicon layers 42, 43 are exposed.

Then, as depicted in FIG. 21, an insulating film 47 is formed all over the surface. The insulating film 47 corresponds to the gate insulating film 9 described with reference to FIG. 1. Subsequently, the insulating film 47 on an upper surface of the silicon layer 43 and on the insulating film 46 is removed so as to remain only on the side surfaces of the groove 45.

Figure 22:
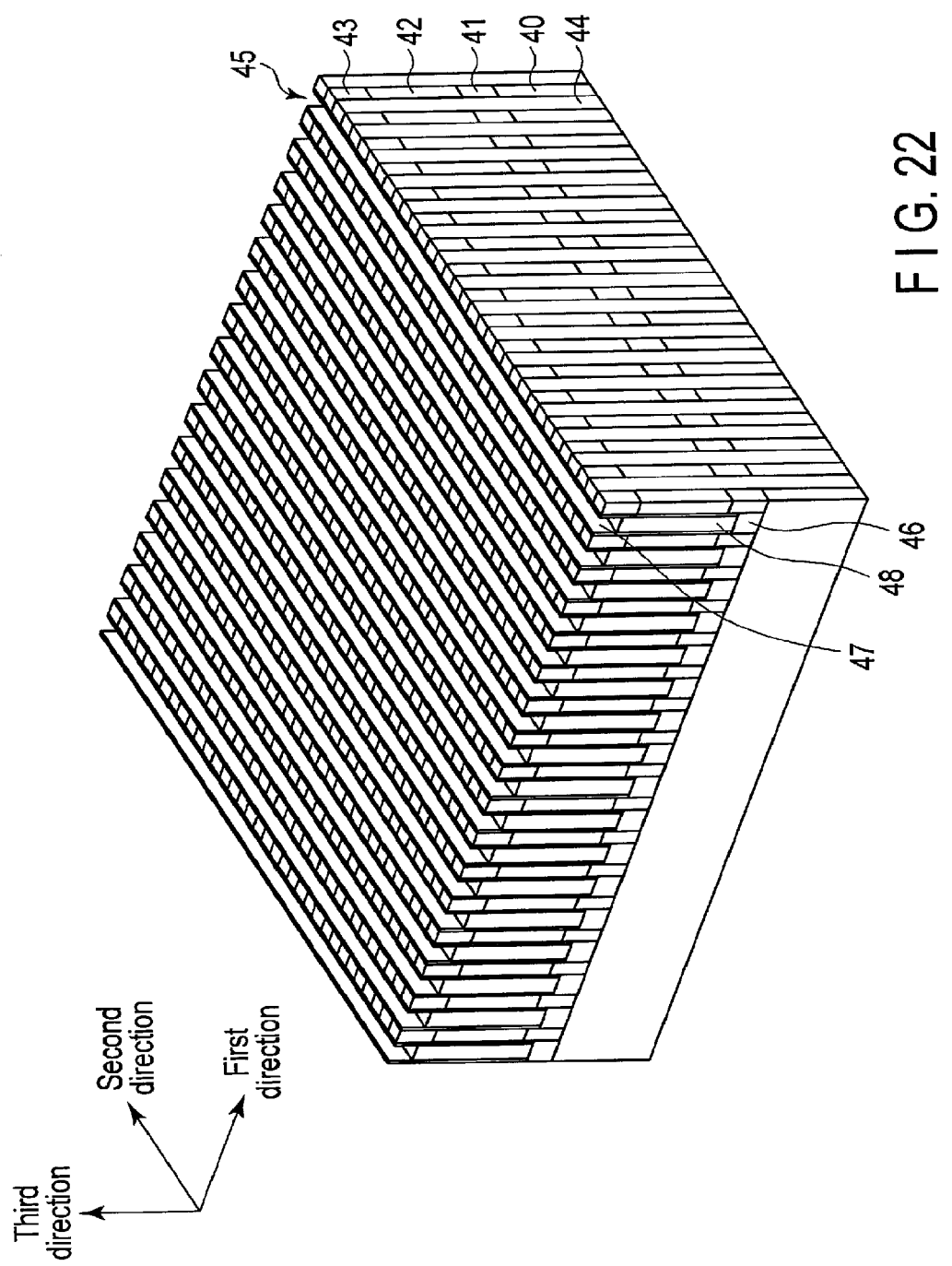

Then, as depicted in FIG. 22, a conductive film 48 is buried in the groove 45. The conductive film 48 is, for example, an n$^+$-type polycrystalline silicon layer and corresponds to the select gate line SSG described with reference to FIG. 1. Then, an upper surface of the conductive film 48 is etched back to a film thickness of, for example, approximately 140 nm. In the present step, a bottom surface of the conductive film 48 is formed below an interface between the silicon layers 41 and 42, and the upper surface of the conductive film 48 is formed above an interface between the silicon layers 42 and 43.

Then, an insulating film 49 (for example, a silicon oxide film) is formed all over the surface. Then, the insulating film 49 is polished using, for example, the CMP method so as to remain only in the groove 45 as depicted in FIG. 23. As a result, the upper surface of the silicon layer 43 is exposed.

Then, as depicted in FIG. 24, an insulating film 51 with a film thickness of, for example, 20 nm is formed on the silicon layer 43 and the insulating film 49. Then, 16 layers of a word line film 52 are formed. The word line film 52 corresponds to the word line WL described with reference to FIG. 1. Furthermore, the word line film 52 is formed using, for example, TiN as a material and has a film thickness of, for example, approximately 10 nm. Additionally, an insulating film 53 (for example, a silicon oxide film) with a film thickness of, for example, 7 nm is formed between the stacked word line films 52. Subsequently, an insulating film 54 (for example, a silicon oxide film) with a film thickness of, for example, 13 nm is formed on the uppermost layer (in the present example, the 16th layer) of the word line film 52.

Then, as depicted in FIG. 25, the insulating films 54, 53, 51 and the word line film 52 are patterned into a stripe shape along the first direction using the photolithography technique and the RIE technique. This patterning step is executed under conditions of, for example, a line width of approximately 20 nm and an inter-line spacing of approximately 28 nm (half pitch: 24 nm). Furthermore, the present step is executed such that the insulating films 54, 53, 51 and the word line film 52 remain on the underlying insulating film 44. As a result of the present step, the word lines WL are formed, and the upper surface of the silicon layer 43 and an upper layer of the insulating film 49 are exposed at the bottom of a groove 55 resulting from the patterning.

Figure 26:
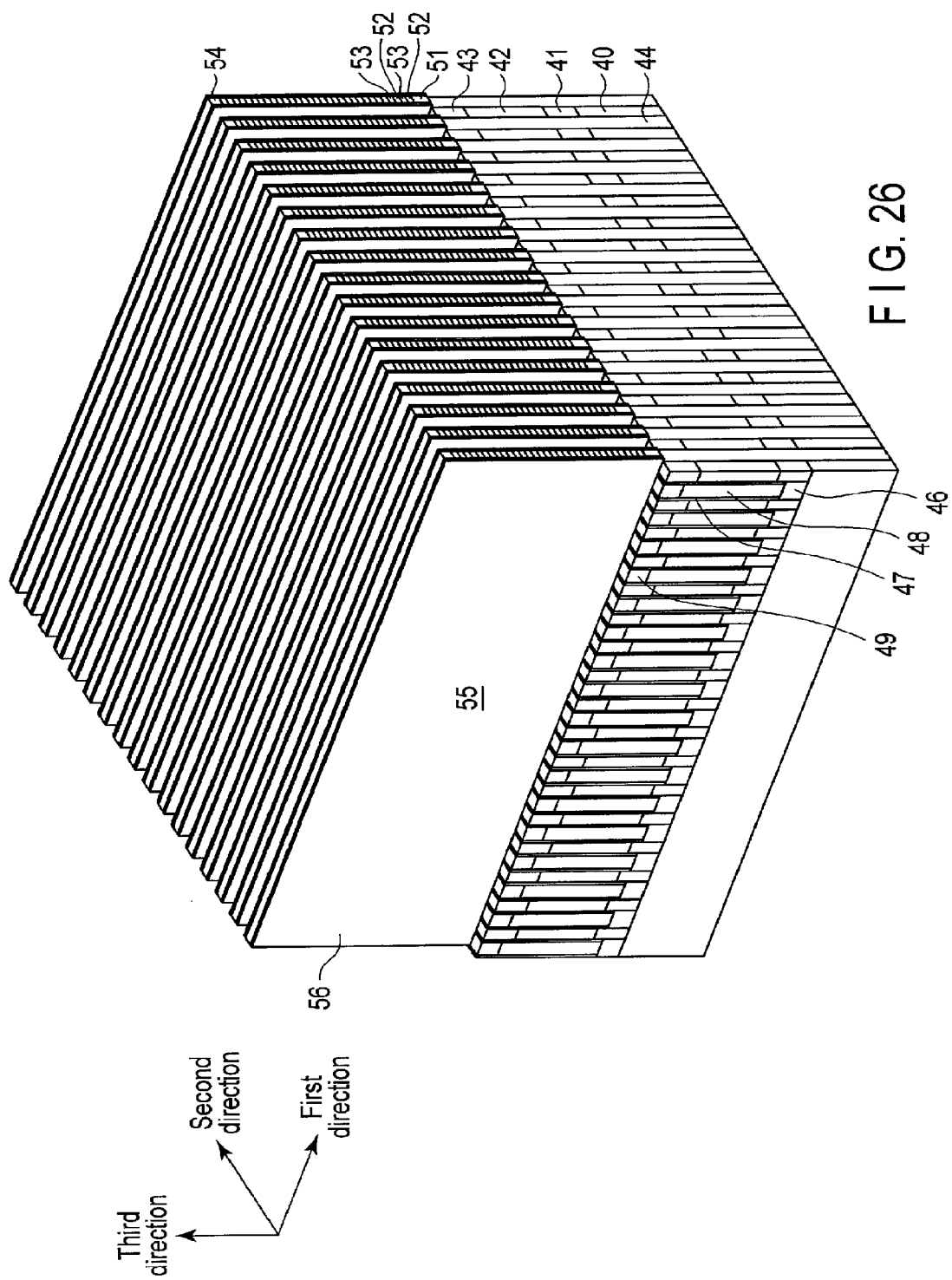

Then, as depicted in FIG. 26, a resistance change material 56 is formed on a bottom surface and side surfaces of the groove 55 and on an upper surface of the insulating film 54. The resistance change material 56 corresponds to the resistance change material 4 described with reference to FIG. 1. The resistance change material is formed to have a film thickness of, for example, approximately 4 nm so as to avoid filling the inside of the groove 54 with the resistance change material. Then, etch-back is performed to remove the resistance change material 56 located at the bottom of the groove 55 and on the upper surface of the insulating film 54. As a result, the upper surfaces of the silicon layer 43 and the insulating film 49 are exposed again at the bottom of the groove 55.

Figure 27:
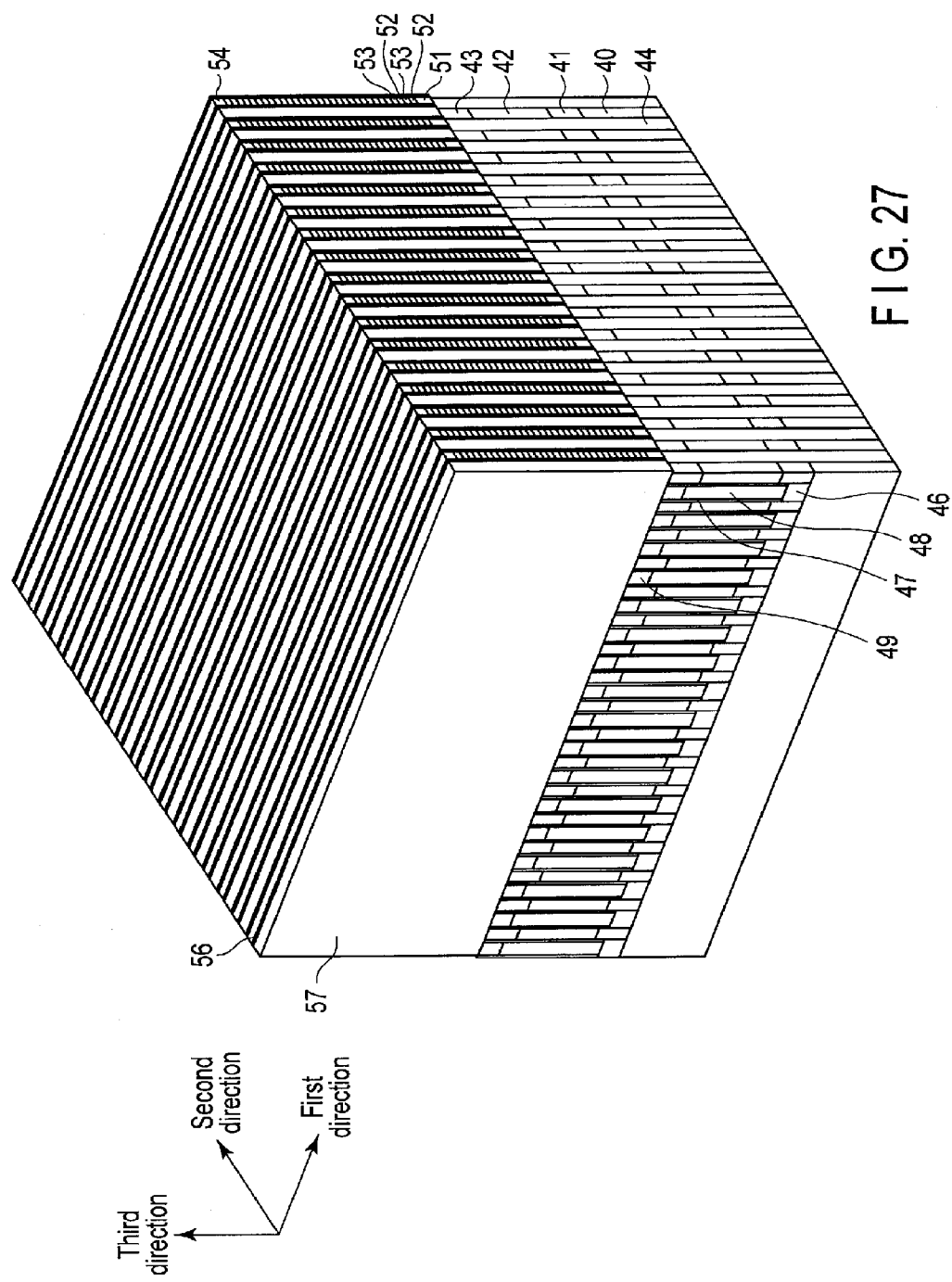

Then, as depicted in FIG. 27, a bit line film 57 is formed all over the surface and then polished using the CMP method so as to remain only inside the groove 55. The bit line film 57 corresponds to the bit line BL described with reference to FIG. 1 and is formed using, for example, n$^+$-type polycrystalline silicon as a material.

Figure 28:
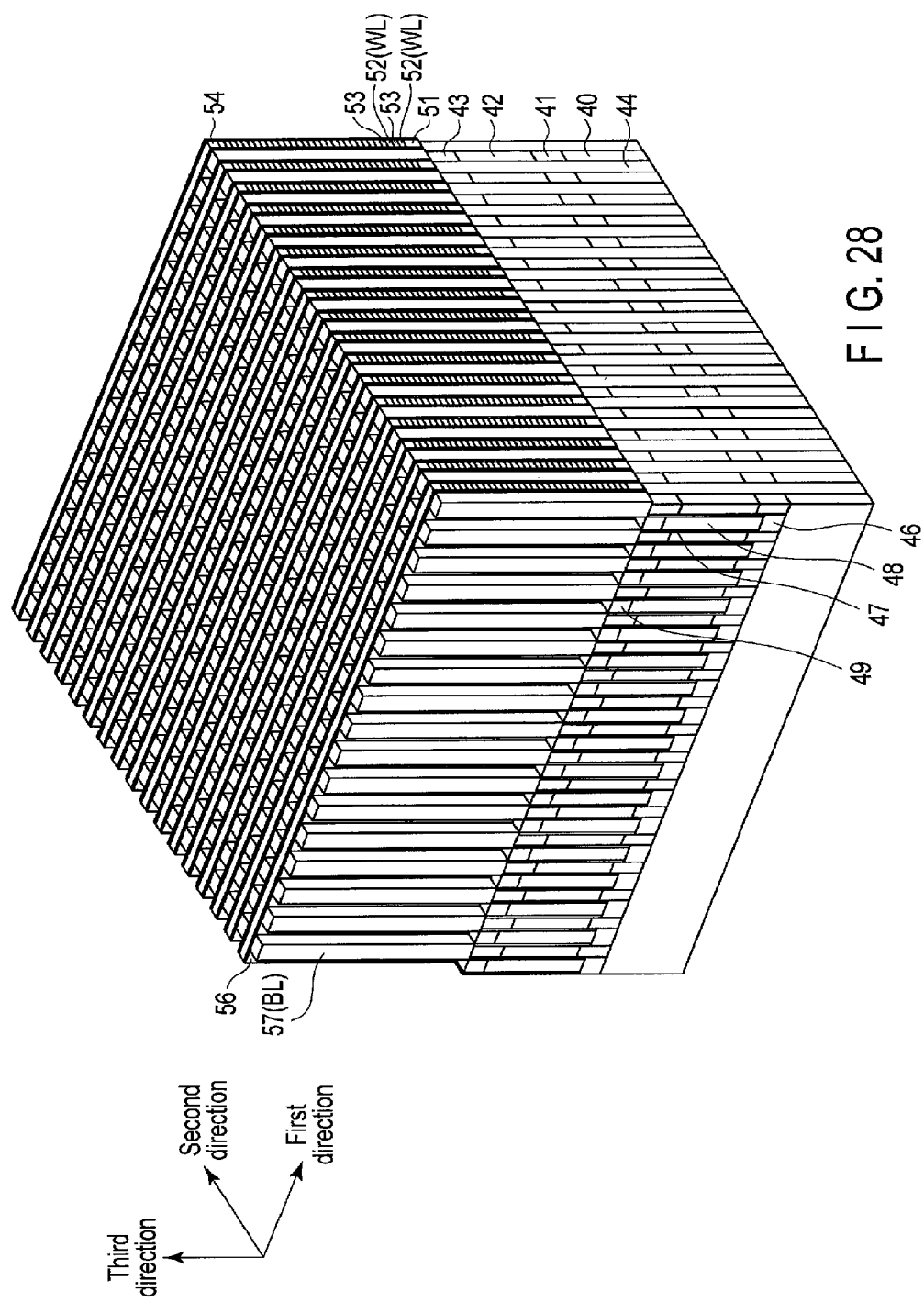

Then, as depicted in FIG. 28, the bit line film 57 is patterned into pillars using the photolithography technique and the RIE technique. This patterning step is executed under conditions of, for example, a line width of approximately 24 nm and an inter-line spacing of also approximately 24 nm. Furthermore, the present step is executed such that the bit line film 57 remains on the underlying silicon layer 43. As a result of the present step, the bit lines BL are completed.

Then, an interlayer insulating film is buried between the adjacent bit lines BL to complete a memory cell array. Subsequently, for example, steps of connecting the word lines WL and the global bit lines GBL to the CMOS circuit 32 and the like are executed. Moreover, a passivation step is executed as is the case with normal semiconductor devices, and furthermore, interconnect connecting sections serving as I/O sections are formed. Finally, inspection, dicing, and the like, so called post-steps, are executed to complete the ReRAM described in the first embodiment.

<3> Third Embodiment

Now, a memory device according to a third embodiment will be described. The present embodiment relates to an ReRAM configured differently from the ReRAM described in the first embodiment.

<3-1> Configuration of the Memory Cell Array

As depicted in FIG. 29, a plurality of global column lines 1, a plurality of row lines 2, and a plurality of column lines 3 are provided in a memory cell array 21. The plurality of global column lines 1 are arranged such that each of the global column lines 1 extends in a first direction and that the global column lines 1 lie parallel to one another along a second direction orthogonal to the first direction and in a lowermost layer of the memory cell array 21. The plurality of row lines 2 are arranged such that each of the row lines 2 extends in the first direction and in the second direction and lies at a higher position than the global lines 1. Layers of the plurality of row lines 2 (a first layer, a second layer, a third layer, . . . , in FIG. 29) are arranged parallel to one another along a third direction (a normal direction of a plane in which the global column lines 1 are arranged) orthogonal to both the first direction and the second direction. The plurality of column lines 3 are arranged such that each of the column lines 3 extends in the third direction and lies so as to penetrate the row lines 2. One end (lower end) of each of the column lines 3 is electrically connectable to one of the global column lines 1. More specifically, the column lines 3 arranged in the same line along the first direction are electrically connectable to the same global column line 1.

In the present example, a resistance change material 4 is provided all over a side surface of each of the column lines 3 (a surface that is opposite to the row lines 2) to function as a memory cell MC. In other words, the memory cell MC with a resistance change element is arranged between each of the row lines 2 and each of the column lines 3.

The global column lines 1, the row lines 2, and the column lines 3 are hereinafter referred to as global bit lines GBL, word lines WL, and bit lines BL, respectively, as is the case with standard memory cells with MOS transistors.

The techniques in <1-4> and <1-5> described in the first embodiment can be applied to the memory cell array 21 depicted in FIG. 29.

<3-2> Method for Manufacturing the Memory Cell Array

Figure 30:
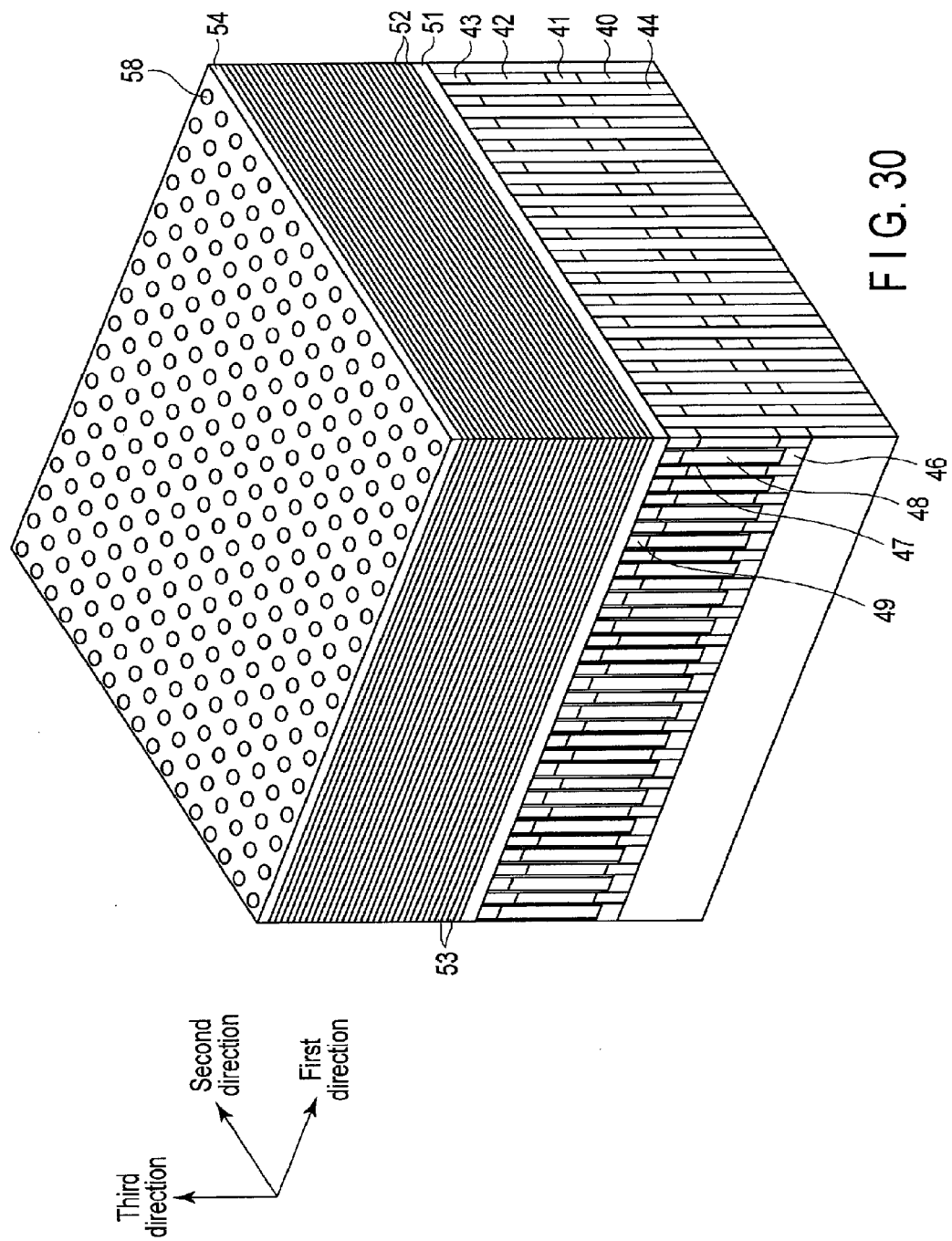
FIG. 30 and FIG. 31 are perspective views sequentially illustrating steps of manufacturing a memory device according to the third embodiment.
Figure 31:
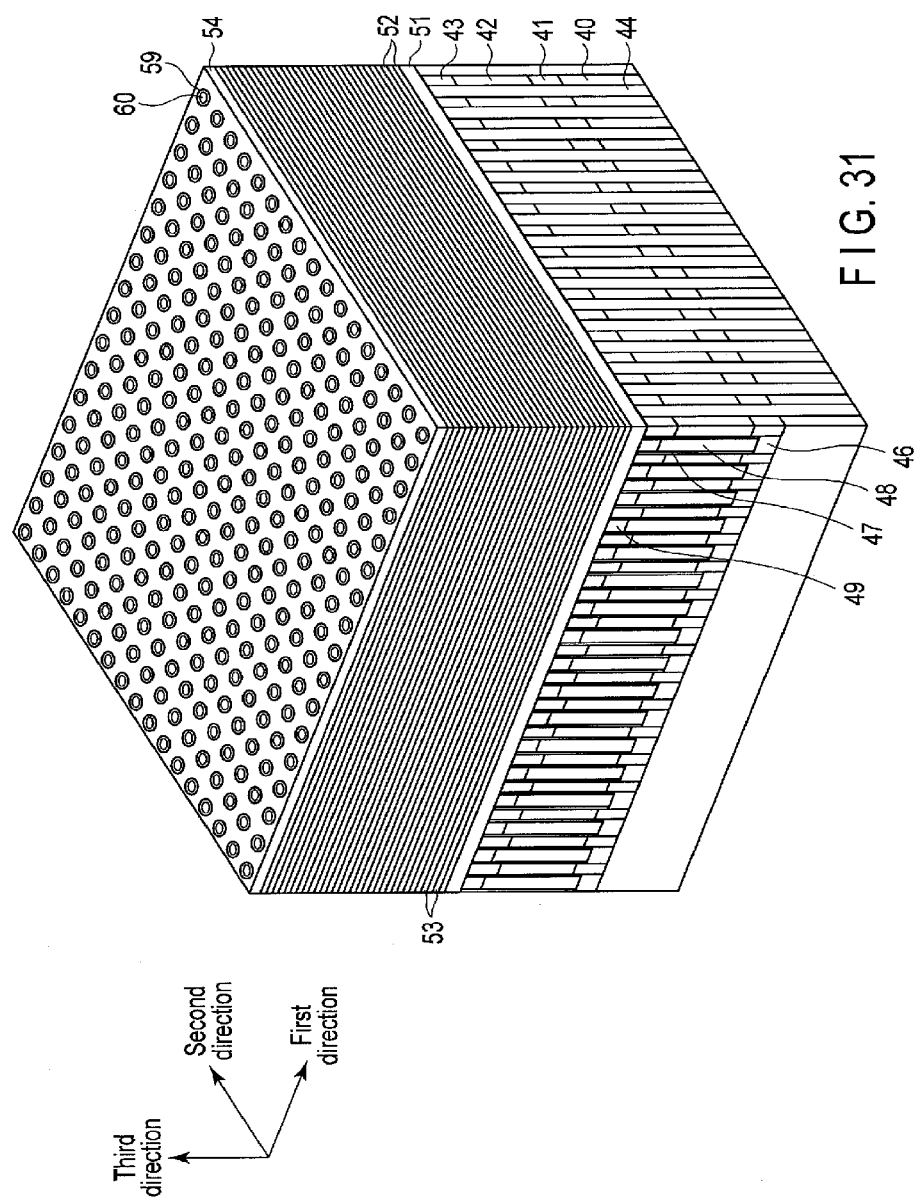

Now, a method for manufacturing an ReRAM according to a third embodiment will be described using FIG. 30 and FIG. 31. FIG. 30 and FIG. 31 are perspective views sequentially depicting steps of manufacturing the ReRAM described in the third embodiment. In the present example, a method is used which is similar to the manufacturing method described with reference to FIGS. 17 to 24. Thus, only differences from the manufacturing method in the second embodiment will be described.

As depicted in FIG. 30, insulating films 54, 53, 51 and word line films 52 are patterned such that holes 58 extending through the insulating films 54, 53, 51 and the word line films 52 extend in the third direction. Furthermore, in the present step, an upper surface of a silicon layer 43 is exposed.

Then, as depicted in FIG. 31, a resistance change material 59 is formed on a bottom surface and a side surface of the hole 58. The resistance change material 59 corresponds to the resistance change material 4 described with reference to FIG. 29. The resistance change material is formed to have a film thickness of, for example, approximately 4 nm so as to avoid filling the inside of the hole 58 with the resistance change material. Then, etch-back is performed to remove the resistance change material 59 located at the bottom of the hole 58 and on the upper surface of the insulating film 54. As a result, the upper surface of the silicon layer 43 is exposed again at the bottom of the groove 55.

Then, a bit line film 60 is formed all over the surface and then polished using the CMP method so as to remain only inside the hole 58. The bit line film 60 corresponds to the bit line BL described with reference to FIG. 29 and is formed using, for example, $n^+$-type polycrystalline silicon as a material. As a result of the present step, the bit lines BL are completed.

Subsequently, for example, steps of connecting the word lines WL and the global bit lines GBL to a CMOS circuit 32 and the like are executed. Moreover, a passivation step is executed as is the case with normal semiconductor devices, and furthermore, interconnect connecting sections serving as I/O sections are formed. Finally, inspection, dicing, and the like, so called post-steps, are executed to complete the ReRAM described in the first embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device comprising:
   a plurality of first interconnects extending in a first direction, and provided in a second direction that is different from the first direction;
   a plurality of second interconnects extending in the first direction, and provided in the second direction and a third direction that is different from the first direction and the second direction;
   a plurality of third interconnects extending in the third direction, and provided in the first direction and second direction;
   memory cells each with resistance change layers provided on two side surfaces of a corresponding one of the third interconnects which surfaces are opposite to each other in the second direction, the resistance change layers being connected to the different second interconnects; and
   a plurality of selectors connecting the third interconnects to the first interconnects,
   wherein one of the selectors includes a semiconductor layer provided between the corresponding third interconnect and the corresponding first interconnect, and gates extending in the second direction and provided, via a gate insulating film, on two side surfaces that are opposite to each other in the first direction.

2. The device according to claim 1, wherein the selector shares one of the gates with another selector adjacent to the selector.

3. The device according to claim 2, wherein one of the selectors corresponding to one of the third interconnects to which the memory cell from which data is to be read is connected, a select voltage is applied to one of the gates provided on the two side surfaces, and an unselect voltage is applied to another of the gates,
every other interconnect of the second interconnects belongs to an identical interconnect group, and
an identical voltage is applied to two or more of the second interconnects which belong to the identical interconnect group during operation.

4. The device according to claim 1,
further comprising:
a fourth interconnect extending in the second direction; and
a fifth interconnect extending in the second direction, wherein
the plurality of second interconnects include a sixth interconnect connected to the fourth interconnect and a seventh interconnect which is adjacent to the sixth interconnect in the second direction and which is connected to the fifth interconnect.

5. The device according to claim 1,
further comprising:
a fourth interconnect extending in the second direction;
a fifth interconnect extending in the second direction;
a sixth interconnect extending in the second direction;
a first memory area including the plurality of second interconnects; and
a second memory area including the plurality of second interconnects and which is adjacent to the first memory area in the first direction,
wherein
the plurality of second interconnects include a seventh interconnect and an eighth interconnect adjacent to the seventh interconnect in the second direction,
in the first memory area,
the seventh interconnect is connected to the fourth interconnect, and
the eighth interconnect is connected to the fifth interconnect, and
in the second memory area,
the seventh interconnect is connected to the sixth interconnect, and
the eighth interconnect is connected to the fourth interconnect.

6. The device according to claim 5,
wherein
the fourth interconnect extending in the second direction is provided at a boundary between the first memory area and the second memory area.

7. The device according to claim 1,
further comprising:
a fourth interconnect extending in the second direction;
a fifth interconnect extending in the second direction;
a sixth interconnect extending in the second direction;
a first memory area including the plurality of second interconnects; and
a second memory area including the plurality of second interconnects and which is adjacent to the first memory area in the first direction,
wherein
the plurality of second interconnects include a seventh interconnect and an eighth interconnect adjacent to the seventh interconnect in the second direction,
in the first memory area,
the seventh interconnect is connected to the fourth interconnect, and
the eighth interconnect is connected to the fifth interconnect, and
in the second memory area,
the seventh interconnect is connected to the fourth interconnect, and
the eighth interconnect is connected to the sixth interconnect.

8. The device according to claim 7,
wherein
the fourth interconnect extending in the second direction is provided at a boundary between the first memory area and the second memory area.

9. A memory device comprising:
a plurality of first interconnects extending in a first direction, and provided in a second direction that is different from the first direction;
a plurality of second interconnects extending in the first direction and the second direction, and provided in a third direction that is different from the first direction and the second direction;
a plurality of third interconnects extending in the third direction, and provided in the first direction and second direction;
memory cells each with a resistance change layer provided on a side surface of a corresponding one of the third interconnects which surface extends along the third direction, the resistance change layer being connected to the second interconnect; and
a plurality of selectors connecting the third interconnects to the first interconnects,
wherein one of the selectors includes a semiconductor layer provided between the corresponding third interconnect and the corresponding first interconnect, and
gates extending in the second direction and provided, via a gate insulating film, on two side surfaces that are opposite to each other in the first direction.

10. The device according to claim 1,
wherein
the first direction and the second direction are orthogonal to each other.

11. The device according to claim 1,
wherein
the first direction and the third direction are orthogonal to each other.

12. The device according to claim 1,
wherein
the second direction and the third direction are orthogonal to each other.

13. The device according to claim 1,
wherein
the first direction and the second direction are orthogonal to each other,
the first direction and the third direction are orthogonal to each other, and
the second direction and the third direction are orthogonal to each other.

14. The device according to claim 6,
further comprising
an area which connects the fourth interconnect, the fifth interconnect, and the sixth interconnect to a base transistor and which is adjacent to the first memory area and the second memory area in the second direction.

15. The device according to claim 8, further comprising
an area which connects the fourth interconnect, the fifth interconnect, and the sixth interconnect to a peripheral circuit and which is adjacent to the first memory area and the second memory area in the second direction.

16. A memory device comprising:
a plurality of first interconnects each extending in a first direction, and provided in a second direction that is different from the first direction;
a plurality of second interconnects each extending in the first direction, and provided in the second direction and a third direction that is different from the first direction and the second direction;
a plurality of third interconnects each extending in the third direction, and provided in the first direction and second direction;
memory cells each with resistance change layers provided on two side surfaces of a corresponding one of the third interconnects which surfaces are opposite to each other in the second direction, the resistance change layers being connected to the different second interconnects;
a plurality of selectors connecting the third interconnects to the first interconnects; and
a controller controlling the plurality of first interconnects, the plurality of second interconnects, and the selector,
wherein one of the selectors includes a semiconductor layer provided between the corresponding third interconnect and the corresponding first interconnect, and
gates extending in the second direction and provided, via a gate insulating film, on two side surfaces that are opposite to each other in the first direction.

17. The device according to claim 16, further comprising:
a first memory area including the plurality of second interconnects; and
a second memory area including the plurality of second interconnects and which is adjacent to the first memory area in the first direction,
wherein
the plurality of second interconnects include a seventh interconnect and an eighth interconnect adjacent to the seventh interconnect in the second direction, and
upon performing a data write, read, or erase operation,
the controller applies an identical potential to the seventh interconnect in the first memory area and to the eighth interconnect in the second memory area.

18. The device according to claim 17, further comprising:
a fourth interconnect connecting the seventh interconnect in the first memory area and the eighth interconnect in the second memory area together and to extend in the second direction, the fourth interconnect being provided at a boundary between the first memory area and the second memory area.

19. The device according to claim 16, further comprising:
a first memory area including the plurality of second interconnects; and
a second memory area including the plurality of second interconnects and which is adjacent to the first memory area in the first direction,
wherein
the plurality of second interconnects include a seventh interconnect and an eighth interconnect adjacent to the seventh interconnect in the second direction, and
upon performing a data write, read, or erase operation,
the controller applies an identical potential to the seventh interconnect in the first memory area and to the seventh interconnect in the second memory area.

20. The device according to claim 19, further comprising:
a fourth interconnect connecting the seventh interconnect in the first memory area and the seventh interconnect in the second memory area together and to extend in the second direction, the fourth interconnect being provided at a boundary between the first memory area and the second memory area.

* * * * *